(12) United States Patent
Lee et al.

(10) Patent No.: US 11,127,353 B2
(45) Date of Patent: Sep. 21, 2021

(54) DISPLAY DEVICE AND SIGNAL INVERSION DEVICE

(71) Applicant: LG Display Co., Ltd., Seoul (KR)

(72) Inventors: Dohyung Lee, Paju-si (KR); ChanYong Jeong, Paju-si (KR); JuHeyuck Baeck, Paju-si (KR); Kwangll Chun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/690,815

(22) Filed: Nov. 21, 2019

(65) Prior Publication Data

US 2020/0184896 A1  Jun. 11, 2020

(30) Foreign Application Priority Data

Dec. 10, 2018 (KR) .................. 10-2018-0157991

(51) Int. Cl.
*G09G 3/3241* (2016.01)
*G09G 3/3266* (2016.01)
*H01L 27/12* (2006.01)

(52) U.S. Cl.
CPC ......... *G09G 3/3266* (2013.01); *G09G 3/3241* (2013.01); *H01L 27/1225* (2013.01)

(58) Field of Classification Search
CPC .............. G09G 3/3266; G09G 3/3241; G09G 2300/0861; G09G 2310/0289; G09G 3/3208; G09G 3/3233; G09G 3/32; G09G 3/3275; G09G 3/36; G09G 3/3685; H01L 27/1225; H01L 27/1255
See application file for complete search history.

(56) References Cited

U.S. PATENT DOCUMENTS

| | | | |
|---|---|---|---|
| 9,401,112 B2 * | 7/2016 | Ohara | G09G 5/18 |
| 2011/0042668 A1 * | 2/2011 | Hama | H01L 27/1225 257/43 |
| 2013/0147524 A1 * | 6/2013 | Hachida | H03K 3/356026 327/108 |
| 2017/0309345 A1 * | 10/2017 | Umezaki | G09G 3/3677 |
| 2018/0012550 A1 * | 1/2018 | Lim | G11C 19/28 |

* cited by examiner

*Primary Examiner* — Bryan Earles
(74) *Attorney, Agent, or Firm* — Morgan, Lewis & Bockius LLP

(57) ABSTRACT

A display device and a signal inversion device are provided. A display device includes: a display panel including: sub-pixels, and scan lines respectively connected to each of the sub-pixels, and light emission control lines respectively connected to each of the sub-pixels, a scan driver circuit for outputting respective scan signals to the scan lines, and a light emission control driver circuit for outputting respective light emission control signals to the light emission control lines, the light emission control driver circuit including: a resistance device electrically connected between: a first voltage node for receiving a first voltage, and an output node electrically connected to the light emission control lines, and a transistor electrically connected between the output node and a second voltage node for receiving a second voltage that is different from the first voltage, wherein an on/off operation of the transistor is controlled according to an input signal.

18 Claims, 19 Drawing Sheets

DISPLAY DEVICE AND SIGNAL INVERSION DEVICE

CROSS-REFERENCE TO RELATED APPLICATION(S)

This application claims the benefit of and priority to Korean Patent Application No. 10-2018-0157991, filed on Dec. 10, 2018, the entirety of which is hereby incorporated by reference.

BACKGROUND

1. Technical Field

The present disclosure relates to a display device and a signal inversion device.

2. Discussion of the Related Art

As an information society has developed, various display devices, such as lighting devices and image display devices, have been developed. Such various display devices may require a configuration for inverting the voltage levels of various signals for various driving processes. The signal inversion devices have been implemented in a form of a circuit manufactured on a printed circuit board. The many transistors and capacitors for the function of inversion of signals make the circuits complex, and many various input power sources are necessary.

Accordingly, if the conventional signal inversion devices are applied to the display devices, the circuitry in the display devices become complex, and the size of the circuitry becomes larger. In addition, an additional manufacturing process for mounting the signal inversion devices in the display devices is also necessary.

SUMMARY

Accordingly, the present disclosure is directed to a display device and a signal inversion device that substantially obviate one or more of the issues due to limitations and disadvantages of the related art.

An aspect of the present disclosure is to provide a small-sized signal inversion device having a simple circuit configuration, and a display device using the same.

Another aspect of the present disclosure is to provide a signal inversion device that can be directly disposed in a display panel, and a display device including the same.

Another aspect of the present disclosure is to provide a signal inversion device, including circuit devices having properties designed to have an excellent signal inversion performance, and a display device including the same.

Another aspect of the present disclosure is to provide a signal inversion device, including circuit devices having a structure designed to have an excellent signal inversion performance, and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a display panel including: a plurality of sub-pixels, and a plurality of scan lines respectively connected to each of the plurality of sub-pixels, and a plurality of light emission control lines respectively connected to each of the plurality of sub-pixels, a scan driver circuit configured to output respective scan signals to the plurality of scan lines, and a light emission control driver circuit configured to output respective light emission control signals to the plurality of light emission control lines, the light emission control driver circuit including: a resistance device electrically connected between: a first voltage node configured to receive a first voltage, and an output node electrically connected to the plurality of light emission control lines, and a transistor electrically connected between the output node and a second voltage node configured to receive a second voltage that is different from the first voltage, wherein an on/off operation of the transistor is controlled according to an input signal.

In another aspect, there is provided a signal inversion device, including: a substrate, an oxide semiconductor layer on the substrate, a first electrode connected to a first portion of the oxide semiconductor layer, a second electrode connected to a second portion of the oxide semiconductor layer, and a gate electrode on or under the oxide semiconductor layer, a metal oxide film on the substrate, a first connection electrode electrically connected to a first end of the metal oxide film, and a second connection electrode electrically connected to a second end of the metal oxide film, opposite to the first end, wherein the gate electrode is configured to receive an input signal, wherein the first connection electrode is configured to receive a first voltage, wherein the second connection electrode and the first electrode are electrically connected to each other or integrated with each other, and are configured to output an output signal, and wherein the second electrode is configured to receive a second voltage that is different from the first voltage.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Figure 1:
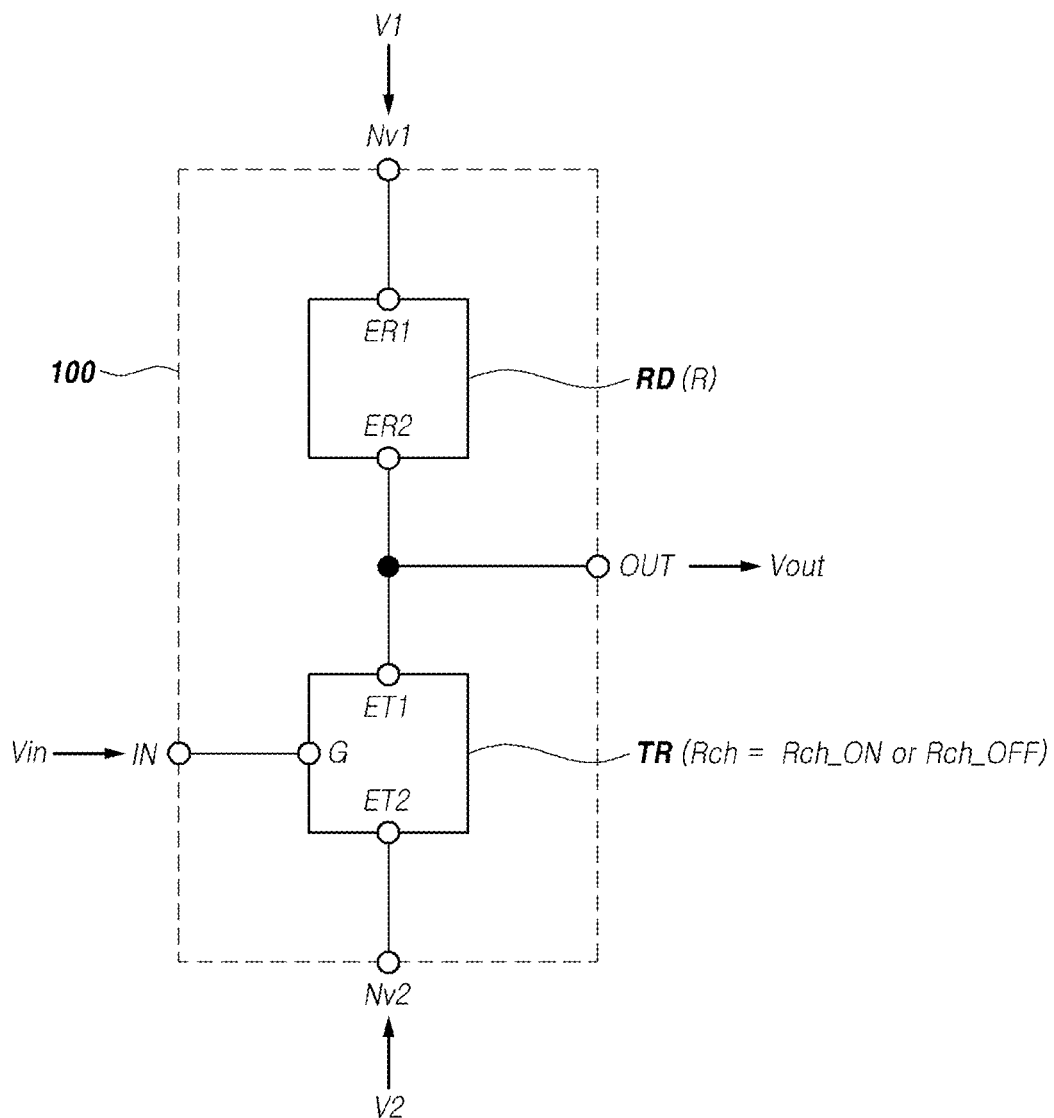
FIG. 1 is a view illustrating a signal inversion device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

Hereinafter, example embodiments of the present disclosure will be described in detail with reference to the accompanying drawings.

FIG. 1 is a view illustrating a signal inversion device according to an embodiment of the present disclosure.

With reference to the example of FIG. 1, a signal inversion device 100 according to an embodiment of the present disclosure may include a resistance device RD and a transistor TR. The signal inversion device 100 may include an input node IN to which an input signal Vin may be input, an output node OUT to which an output signal Vout may be output, a first voltage node Nv1 to which a first voltage V1 may be input, and a second voltage node Nv2 to which a second voltage V2 may be input.

The first voltage V1 and the second voltage V2 may have different voltage values. For example, the first voltage V1 may have a voltage value that may be higher than the second voltage V2. As another example, the second voltage V2 may have a voltage value that may be higher than the first voltage V1.

The resistance device RD may be electrically connected between the first voltage node Nv1 and the output node OUT. An on/off operation of the transistor TR may be controlled by the input signal Vin, and may be electrically connected between the output node OUT and the second voltage node Nv2.

The resistance device RD may include a first connection electrode ER1 and a second connection electrode ER2. The first connection electrode ER1 of the resistance device RD may be electrically connected to the first voltage node Nv1. The second connection electrode ER2 of the resistance device RD may be electrically connected to the output node OUT.

The transistor TR may include a first electrode ET1, a second electrode ET2, and a gate electrode G. The input signal Vin may be applied to the gate electrode G of the transistor TR.

The first electrode ET1 of the transistor TR may be electrically connected to the output node OUT. The second electrode ET2 of the transistor TR may be electrically connected to the second voltage node Nv2. The input signal Vin may be applied to the gate electrode G of the transistor TR.

The second connection electrode ER2 of the resistance device RD and the first electrode ET1 of the transistor TR may be electrically connected to each other or integrated with each other. The transistor TR may be an N-type transistor or a P-type transistor.

When the transistor TR is turned off, a resistance component Rch, having a large resistance value Rch_OFF, may be between the first electrode ET1 and the second electrode ET2. For example, when the transistor TR is turned off, the transistor TR may act as a kind of resistance Rch having a large resistance value Rch_OFF.

When the transistor TR is turned on, a resistance component Rch, having a small resistance value Rch_ON, may be between the first electrode ET1 and the second electrode ET2. For example, when the transistor TR is turned on, the transistor TR may act as a kind of resistance Rch having a small resistance value Rch_ON.

For example, when the transistor TR is turned on, the transistor TR may be regarded as a resistance Rch having a small resistance value Rch_ON, which may be an equivalent to the transistor TR. When the transistor TR is turned off, the transistor TR may be regarded as a resistance Rch having a large resistance value Rch_OFF, which may be an equivalent to the transistor TR.

The resistance value R of the resistance device RD may be larger than a small resistance value Rch_On of the transistor TR when the transistor TR is turned on, and may be smaller than a large resistance value Rch_OFF of the transistor TR when the transistor TR is turned off.

The signal inversion device 100 according to an embodiment of the present disclosure may invert (convert) the voltage level of the input signal Vin, and may output the output signal Vout obtained by inverting the voltage level. The inversion of the voltage level may be an inversion from a high level to a low level, and may mean that the low level may be inverted to the high level.

Figure 2:
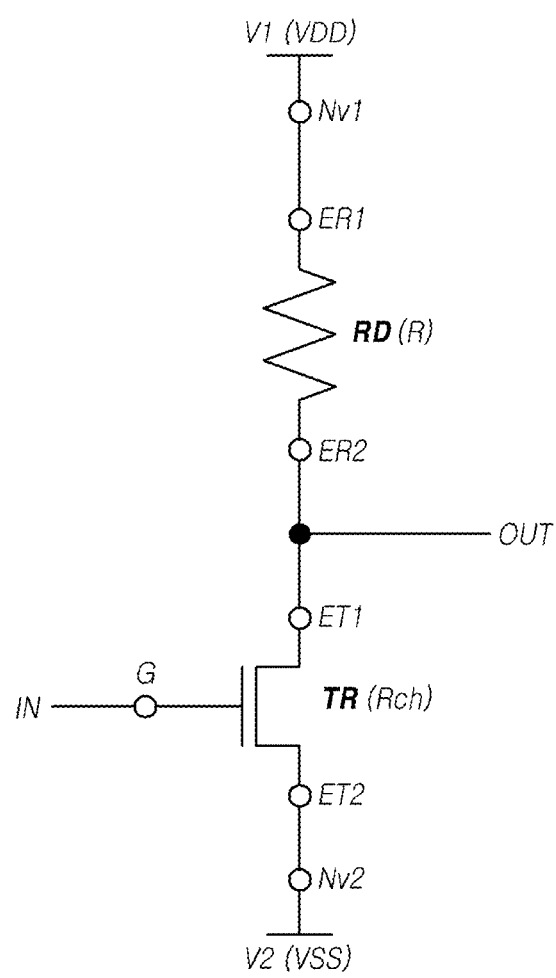
FIG. 2 is a circuit of a signal inversion device according to an embodiment of the present disclosure.
Figure 3:
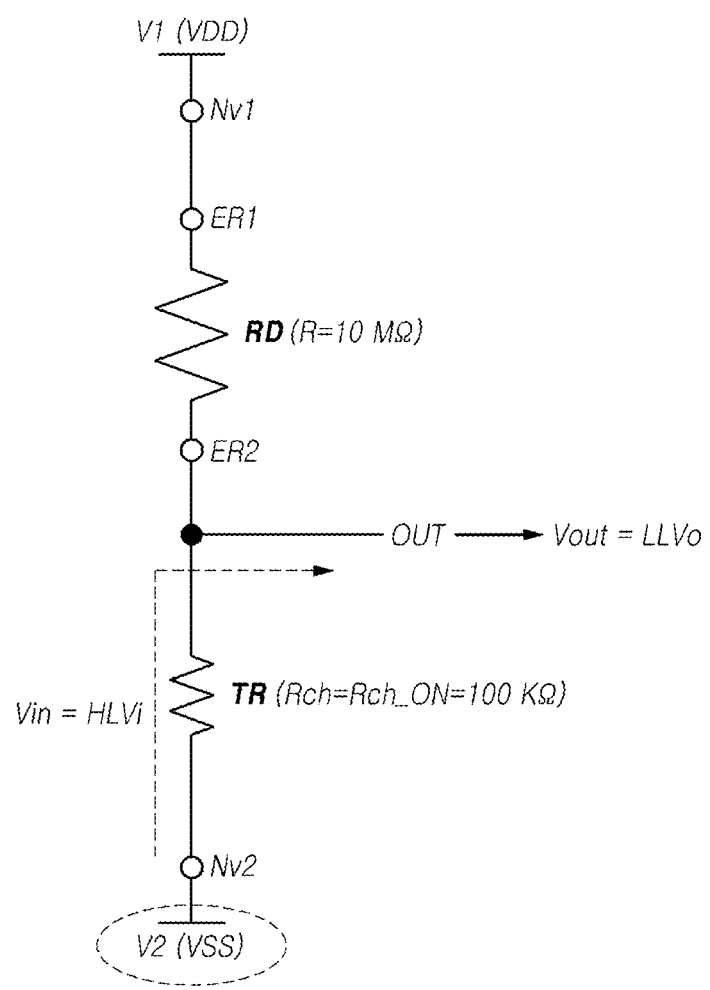
FIGS. 3 and 4 are views illustrating operations of the signal inversion device of FIG. 2.
Figure 4:
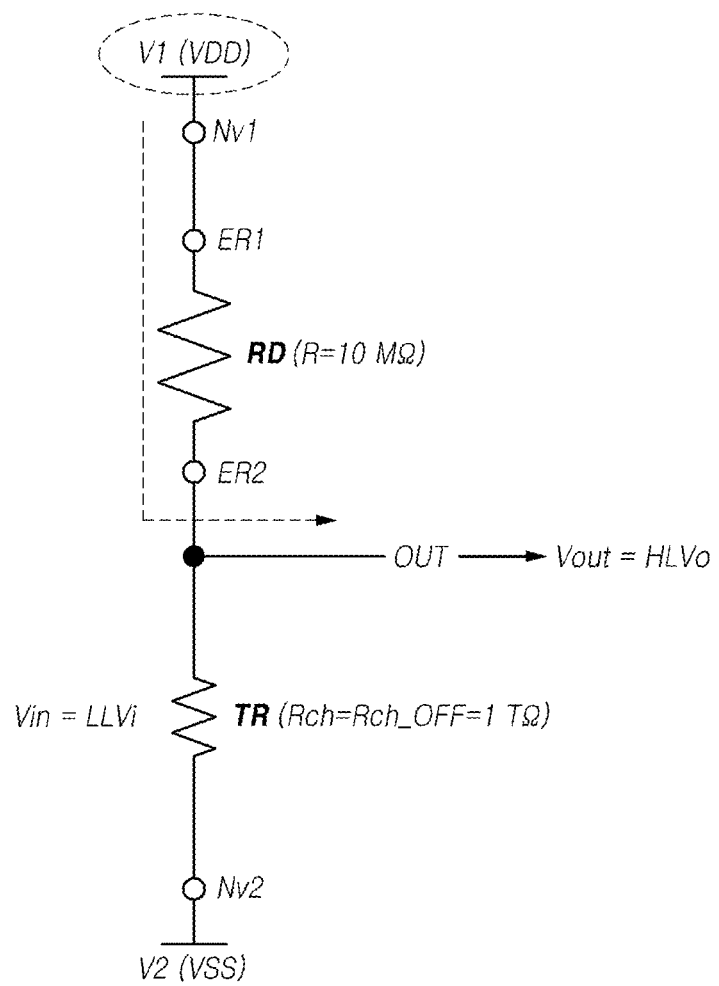

FIG. 2 is a circuit of a signal inversion device according to an embodiment of the present disclosure. FIGS. 3 and 4 are views illustrating operations of the signal inversion device of FIG. 2.

As illustrated in the example of FIG. 2, when the transistor TR of the signal inversion device 100 is an N-type transistor, the first voltage V1 may have a voltage value that is higher than the second voltage V2. For example, the first voltage V1 may be a high potential voltage VDD, and the second voltage V2 may be a low potential voltage VSS.

The resistance value R of the resistance device RD may be larger than a small resistance value Rch_On of the transistor TR when the transistor TR is turned on, and may be smaller than a large resistance value Rch_OFF of the transistor TR when the transistor TR is turned off.

With reference to the example of FIG. 3, when the input signal Vin is a high level voltage HLVi, the transistor TR may be turned on by the input signal Vin of the high level voltage HLVi applied to the gate electrode G. Accordingly, the transistor TR may be regarded as a resistance Rch having a small resistance value Rch_ON, which may be an equivalent to the transistor TR.

Accordingly, the circuit of FIG. 2 may be regarded as a voltage distribution circuit, to which two resistors R and Rch (Rch_ON) are connected in series, which may be an equivalent to the circuit of FIG. 2, as illustrated in FIG. 3. Accordingly, the output signal Vout output to the output node OUT through distribution of voltages may be calculated as in Equation 1.

$$Vout = (VDD - VSS) \times Rch\_ON/(R + Rch\_ON) \quad \text{[Equation 1]}$$

For convenience of description, it may be presumed that, for example, the resistance value R of the resistance device RD may be 10 MΩ (Mega ohm), the small resistance value Rch_ON of the turned-on transistor TR may be 100 kΩ (kilo ohm), the high potential voltage VDD corresponding to the first voltage V1 may be 20 V, and the low potential voltage VSS corresponding to the second voltage V2 may be 0 V. By inserting this into Equation 1, Equation 2 may be obtained.

$$Vout=20V \times 100K/(10M+100K)=20V/101=around\ 0.198V \quad \text{[Equation 2]}$$

Accordingly, the output signal Vout may have a low level voltage value LLVo=0.198 V that may be similar to a low potential voltage VSS corresponding to the second voltage V2. For example, the signal inversion device 100 may output an output signal Vout having a low level voltage LLVo corresponding to the second voltage V2 to the output node OUT.

With reference to the example of FIG. 4, when the input signal Vin is a low level voltage LLVi, the transistor TR may be turned off by the input signal Vin of the low level voltage LLVi applied to the gate electrode G. For example, the transistor TR may be regarded as a resistance Rch having a large resistance value Rch_OFF, which may be an equivalent to the transistor TR.

Accordingly, the circuit illustrated in the FIG. 2 example may be regarded as a voltage distribution circuit, to which two resistors R and Rch (Rch_OFF) may be connected in series to each other, which may be an equivalent to the circuit of FIG. 2, as illustrated in FIG. 4. Accordingly, the output signal Vout that may be output to the output node OUT through distribution of voltages may be calculated as in Equation 3.

$$Vout=(VDD-VSS) \times Rch\_OFF/(R+Rch\_OFF) \quad \text{[Equation 3]}$$

For convenience of description, it may be presumed that, for example, the resistance value R of the resistance device RD may be 10 MΩ (Mega ohm), the large resistance value Rch_OFF of the turned-off transistor TR may be 1 TΩ (Tera ohm), the high potential voltage VDD corresponding to the first voltage V1 may be 20 V, and the low potential voltage VSS corresponding to the second voltage V2 may be 0 V. By inserting this into Equation 3, Equation 4 may be obtained.

$$Vout=20V \times 1T/(10 \times M+1T)=around\ 20V \quad \text{[Equation 4]}$$

Accordingly, the output signal Vout may have a high level voltage value HLVo≈20 V that may be similar to a high potential voltage VDD corresponding to the first voltage V1. For example, the signal inversion device 100 may output an output signal Vout having a high level voltage HLVo corresponding to the first voltage V1 to the output node OUT.

Figure 5:
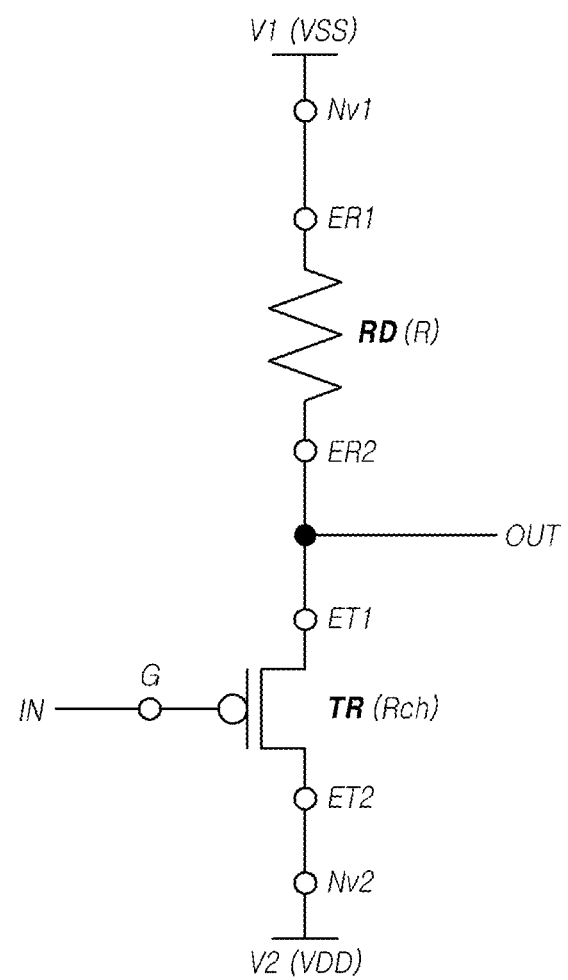
FIG. 5 is another circuit of a signal inversion device according to an embodiment of the present disclosure.
Figure 6:
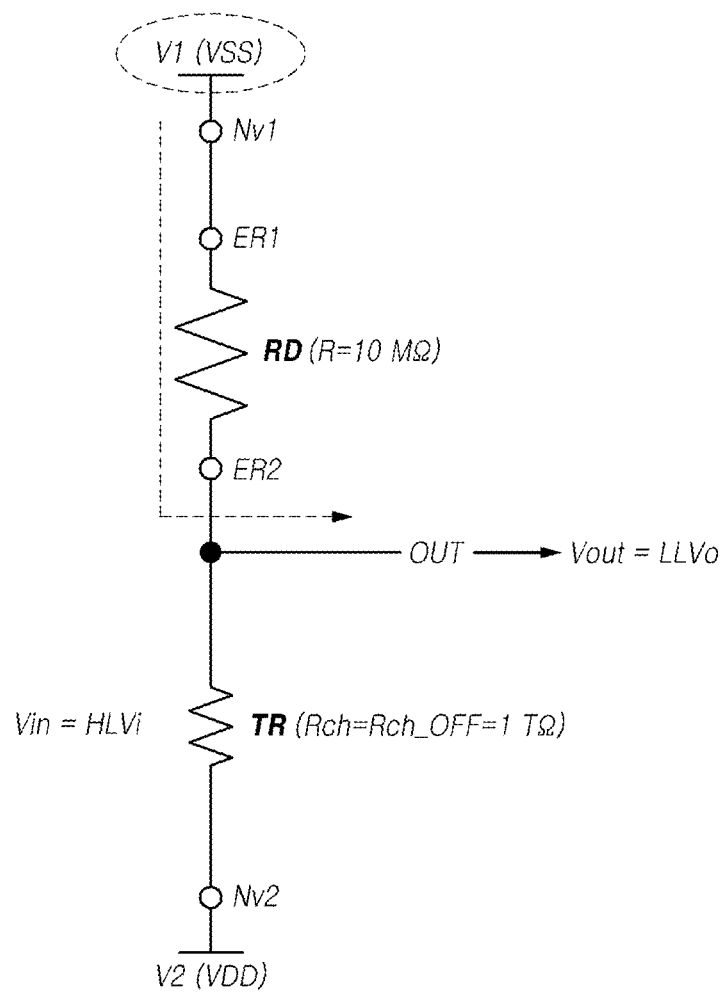
FIGS. 6 and 7 are views illustrating operations of the signal inversion device of FIG. 5.
Figure 7:
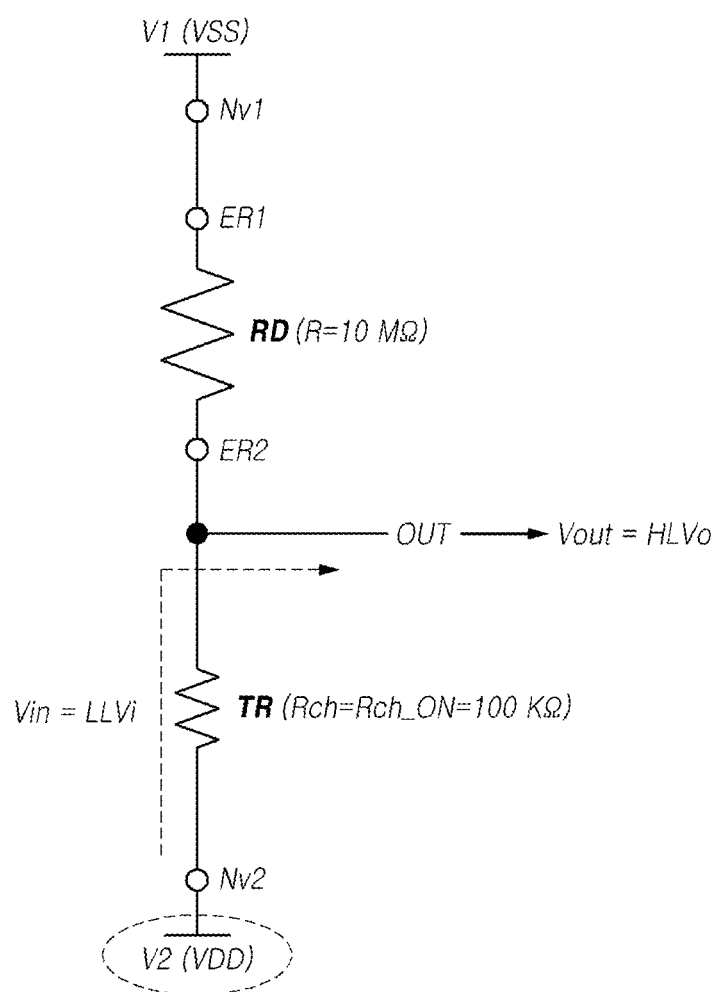

FIG. 5 is a circuit of another signal inversion device according to an embodiment of the present disclosure. FIGS. 6 and 7 are views illustrating operations of the signal inversion device of FIG. 5.

As illustrated in the example of FIG. 5, when the transistor TR is a P-type transistor, the second voltage V2 may have a voltage value that is higher than the first voltage V1. For example, the second voltage V2 may be a high potential voltage VDD, and the first voltage V1 may be a low potential voltage VSS. The resistance value R of the resistance device RD may be larger than a small resistance value Rch_On of the transistor TR when the transistor TR is turned on, and may be smaller than a large resistance value Rch_OFF of the transistor TR when the transistor TR is turned off.

With reference to the example of FIG. 6, when the input signal Vin is a high level voltage HLVi, the transistor TR may be turned off by the input signal Vin of the high level voltage HLVi applied to the gate electrode G. For example, the transistor TR may be regarded as a resistance Rch having a large resistance value Rch_OFF, which may be an equivalent to the transistor TR.

Accordingly, the circuit illustrated in the FIG. 5 example may be regarded as a voltage distribution circuit, to which two resistors R (Rch=Rch_OFF) may be connected in series to each other, which may be an equivalent to the circuit of FIG. 5, as illustrated in FIG. 6. Accordingly, the output signal Vout output to the output node OUT through distribution of voltages may be calculated as in Equation 5.

$$Vout=(VDD-VSS) \times R/(R+Rch\_OFF) \quad \text{[Equation 5]}$$

For convenience of description, it may be presumed that, for example, the resistance value R of the resistance device RD may be 10 MΩ, the large resistance value Rch_OFF of the turned-off transistor TR may be 1 TΩ, the low potential voltage VSS corresponding to the first voltage V1 may be 0 V, and the high potential voltage VDD corresponding to the second voltage V2 may be 20 V. By inserting this into Equation 5, Equation 6 may be obtained.

$$Vout=20V \times 10M/(10M+1T)=around\ 0V \quad \text{[Equation 6]}$$

Accordingly, the output signal Vout may have a low level voltage value LLVo=around 0 V that may be similar to a low potential voltage VSS corresponding to the first voltage V1. For example, the signal inversion device 100 may output an output signal Vout having a low level voltage LLVo corresponding to the first voltage V1 to the output node OUT.

With reference to the example of FIG. 7, when the input signal Vin is a low level voltage LLVi, the transistor TR may be turned on by the input signal Vin of the low level voltage LLVi applied to the gate electrode G. Accordingly, the transistor TR may be regarded as a resistance Rch having a small resistance value Rch_ON, which may be an equivalent to the transistor TR.

Accordingly, the circuit of FIG. 5 may be regarded as a voltage distribution circuit, to which two resistors R (Rch=Rch_ON) may be connected in series, which may be an equivalent to the circuit of FIG. 5, as illustrated in FIG. 7. Accordingly, the output signal Vout output to the output node OUT through distribution of voltages may be calculated as in Equation 7.

$$Vout=(VDD-VSS) \times R/(R+Rch\_ON) \quad \text{[Equation 7]}$$

For convenience of description, it may be presumed that, for example, the resistance value R of the resistance device RD may be 10 MΩ, the small resistance value Rch_ON of the turned-on transistor TR may be 100 kΩ, the low potential voltage VSS corresponding to the first voltage V1 may be 0 V, and the high potential voltage VDD corresponding to the second voltage V2 may be 20 V. By inserting this into Equation 7, Equation 8 may be obtained.

$$Vout=20V \times 10M/(10M+100K)=around/9.8V \quad \text{[Equation 8]}$$

Accordingly, the output signal Vout may have a high level voltage value HLVo=around 19.8 V that may be similar to a high potential voltage VDD corresponding to the second voltage V2. For example, the signal inversion device 100 may output an output signal Vout having a high level voltage HLVo corresponding to the second voltage V2 to the output node OUT.

In the examples of FIGS. 2 to 7, the high level voltage HLVi of the output signal Vout may be the same as the high level voltage HLVo of the input signal Vin, but may be slightly different from the high level voltage HLVo. Similarly, the low level voltage LLVi of the output signal Vout may be the same as the low level voltage LLVo of the input signal Vin, but may be slightly different from the low level voltage LLVo.

In the examples of FIGS. 2 to 7, the high level voltage HLVi of the output signal Vout may be the same as the high potential voltage VDD but may be slightly different from the high potential voltage VDD. Similarly, the low level voltage LLVi of the output signal Vout may be the same as the low potential voltage VSS, but may be slightly different from the low potential voltage VSS.

Figure 8:
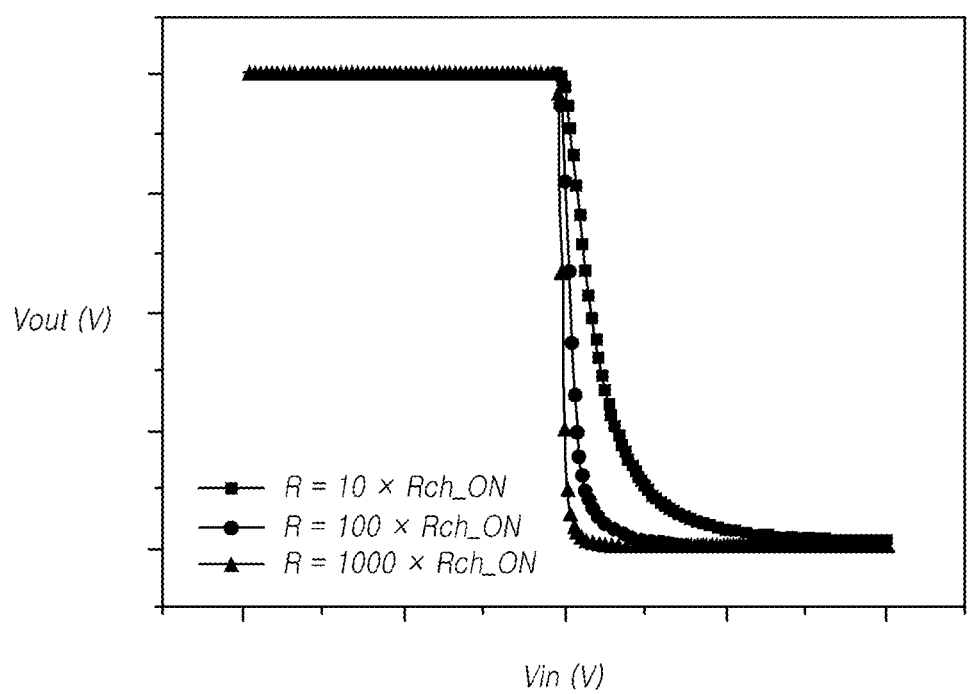
FIG. 8 is a graph depicting the performance of a signal inversion device according to an embodiment of the present disclosure.

FIG. 8 is a graph depicting the performance of a signal inversion device according to an embodiment of the present disclosure.

As described above, the signal inversion device 100 according to an embodiment of the present disclosure may invert the voltage level of the input signal Vin, and may output the output signal Vout obtained by inverting the voltage level. The inversion of the voltage may be an inversion from a high level to a low level, and may include an inversion of the low level to the high level.

In the signal inversion device 100 according to an embodiment of the present disclosure, the high level voltage HLVi of the output signal Vout may be the same as the high level voltage HLVo of the input signal Vin, but may be slightly different from the high level voltage HLVo. Similarly, the low level voltage LLVi of the output signal Vout may be the same as the low level voltage LLVo of the input signal Vin, but may be slightly different from the low level voltage LLVo.

The high level voltage HLVi of the output signal Vout may be the same as the high potential voltage VDD, but may be slightly different from the high potential voltage VDD. Similarly, the low level voltage LLVi of the output signal Vout may be the same as the low potential voltage VSS, but may be slightly different from the low potential voltage VSS.

The voltage difference may be caused by distribution of voltages due to the resistance value R of the resistance device RD and the resistance Rch=Rch_ON or Rch_OFF of the transistor TR. Accordingly, the signal inversion performance of the signal inversion device 100 may be greatly changed based on how the resistance value R of the resistance device RD and the resistance Rch=Rch_ON or Rch_OFF of the transistor TR are designed. The resistance value R of the resistance device RD may be larger than a small resistance value Rch_On of the transistor TR when the transistor TR is turned on, and may be smaller than a very large resistance value Rch_OFF of the transistor TR when the transistor TR is turned off.

FIG. 8 is a graph depicting an experimental result in which a voltage level inversion between the input signal Vin and the output signal Vout was experimentally obtained when the resistance value R of the resistance device RD was designed to become 10 times, 100 times, and 1000 times as large as the small resistance value Rch_ON of the transistor TR when the transistor TR is turned on. With reference to FIG. 8, it can be identified that, as the resistance value R of the resistance device RD becomes larger than the small resistance value Rch_ON of the transistor TR when the transistor TR is turned on, the voltage level inversion performance between the input signal Vin and the output signal Vout tends to be improved.

With reference to FIG. 8, it can be identified that, as the resistance value R of the resistance device RD is designed to be as large as around 100 times or more of the small resistance value Rch_ON of the transistor TR when the transistor TR is turned on, the voltage level inversion performance between the input signal Vin and the output signal Vout may be improved to be almost ideal. Accordingly, when the structures of the resistance device RD and the transistor TR are designed, it should be designed such that the resistance value R of the resistance device RD becomes around 100 times or more the small resistance value Rch_ON of the transistor TR when the transistor TR is turned on.

The resistance device RD and the transistor TR of the signal inversion device 100 according to an embodiment of the present disclosure may simply be a resistance component or a transistor component, but may be formed together with another electrode or wiring lines on the display panel when the display panel of the display device, having a lighting or image display function, is manufactured. Because the existing circuit or device for inverting a signal level may include considerably many transistors and capacitors, and may require various kinds of power sources, the size of the circuit or device may be large, and it may be difficult to manufacture the circuit or device.

In comparison, when the signal inversion device 100 according to the embodiments of the present disclosure requires one resistance device RD, one transistor TR, and two power sources V1 and V2, the size of the device may be small, and it may be easy to manufacture. Although the signal inversion device 100 according to an embodiment of the present disclosure has been described above in the aspect of a circuit, the structural and physical property features of the signal inversion device 100 for the excellent signal inversion performance, the size reduction, and the ease of manufacturing will be described below in detail.

Figure 9:
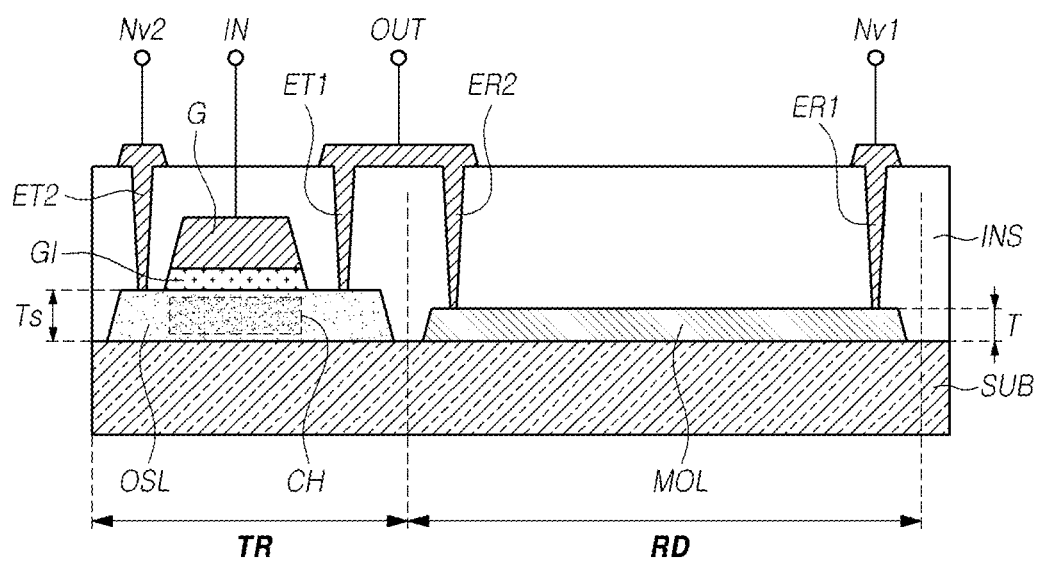
FIG. 9 is a view of a cross-sectional structure of a signal inversion device according to an embodiment of the present disclosure.
Figure 10:
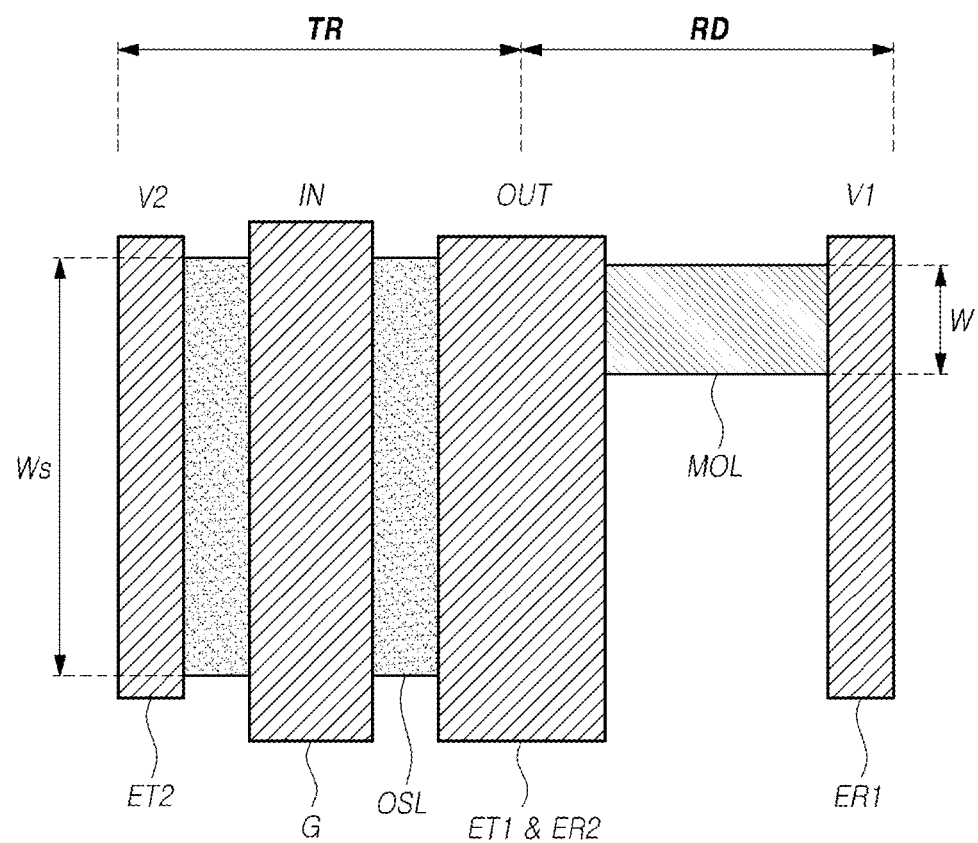
FIG. 10 is a view of a plane structure of a signal inversion device according to an embodiment of the present disclosure.
Figure 11:
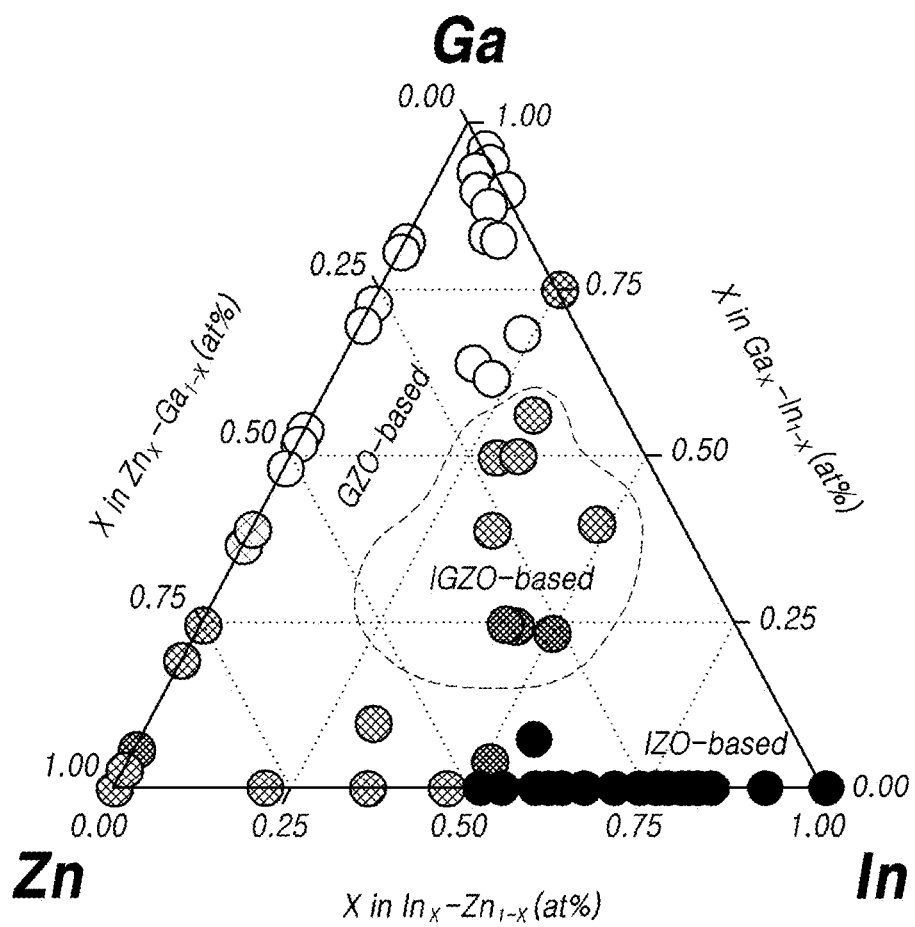
FIG. 11 is a view for explaining a physical property of a thin film of an oxide semiconductor layer of a transistor included in a signal inversion device according to an embodiment of the present disclosure.
Figure 11:
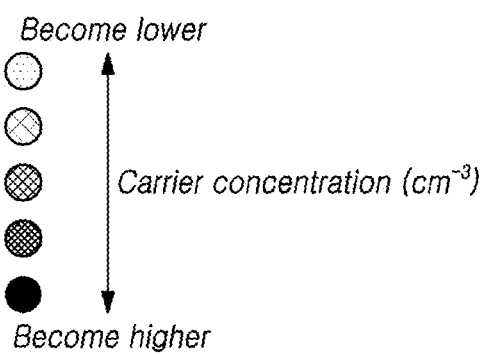
Figure 12:
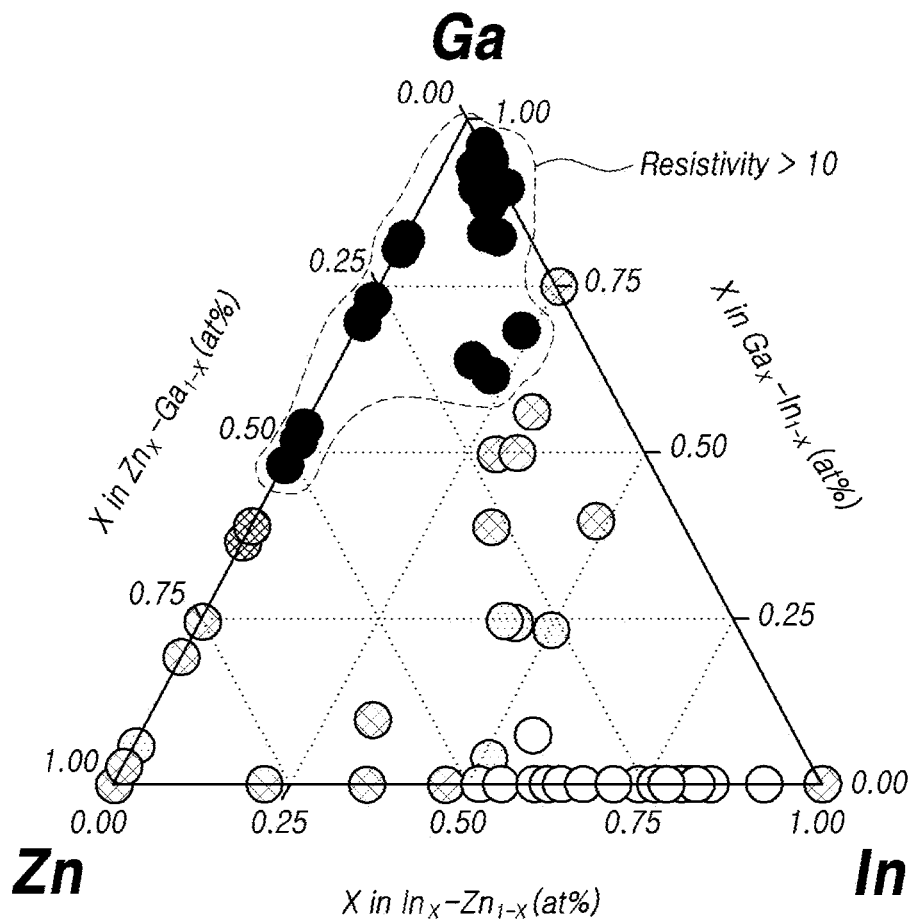
FIGS. 12 and 13 are views illustrating a structural feature and a physical property of a thin film of a resistance device included in a signal inversion device according to an embodiment of the present disclosure.
Figure 13:
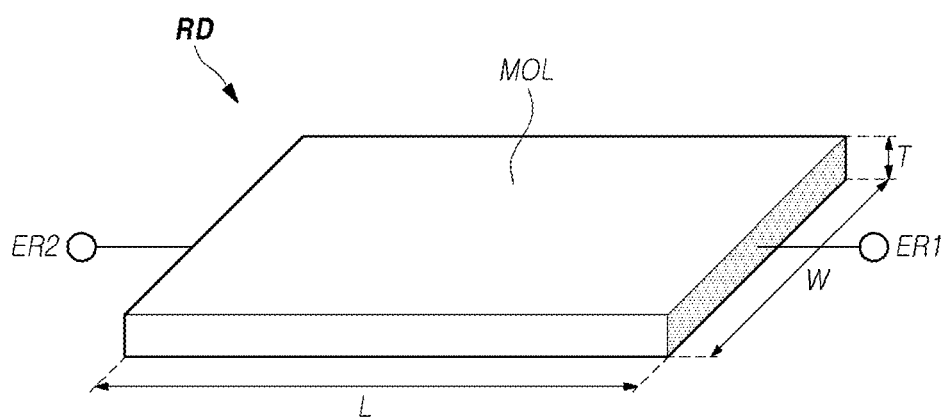

FIG. 9 is a view of a cross-sectional structure of a signal inversion device according to an embodiment of the present disclosure. FIG. 10 is a view of a plane structure of a signal inversion device according to an embodiment of the present disclosure. FIG. 11 is a view for explaining a physical property of a thin film of an oxide semiconductor layer of a transistor included in a signal inversion device according to an embodiment of the present disclosure. FIGS. 12 and 13 are views illustrating a structural feature and a physical property of a thin film of a resistance device included in a signal inversion device according to an embodiment of the present disclosure.

With reference to FIG. 9, the transistor TR and the resistance device RD may be located on the substrate SUB. With reference to the examples of FIGS. 9 and 10, the transistor TR may include an oxide semiconductor layer OSL, a first electrode ET1 connected to a portion of the oxide semiconductor layer OSL, a second electrode ET2 connected to another portion of the oxide semiconductor layer OSL, and a gate electrode G. The first electrode ET1 may be electrically connected to the output node OUT, and an output signal Vout may be output from the first electrode ET1. The second electrode ET2 may be electrically connected to a second voltage node Nv2, and a second voltage V2 may be applied to the second electrode ET2.

As illustrated in FIG. 9, the gate electrode G may be located on the oxide semiconductor layer OSL, and may be located under the oxide semiconductor layer OSL according to occasions. A gate insulation film GI may be located between the gate electrode G and the oxide semiconductor layer OSL. The gate electrode G may be electrically connected to an input node IN, and an input signal Vin may be applied to the gate electrode G.

When the input signal Vin applied to the gate electrode G is a turn-on level voltage, a channel GH may be disposed in the oxide semiconductor layer OSL. When the transistor TR is an N-type transistor, the turn-on level voltage may be a high level voltage. When the transistor TR is a P-type transistor, the turn-on level voltage may be a low level voltage. In a portion of the oxide semiconductor layer OS1, in which the channel CH is not disposed, a portion connected to the first electrode ET1 and a portion connected to the second electrode ET2 may be portions that becomes conductive through plasma processing or ion implantation.

With reference to FIGS. 9 and 10, the resistance device RD may include a metal oxide film MOL, a first connection electrode ER1 electrically connected to one end of the metal oxide film MOL, and a second connection electrode ER2 electrically connected to an opposite end of the metal oxide film MOL. The first connection electrode ER1 may be electrically connected to a first voltage node Nv1, and a first voltage V1 may be applied to the first connection electrode ER1.

The second connection electrode ER2 may be electrically connected to the output node OUT, and an output signal Vout may be output from the second connection electrode ER2. The second connection electrode ER2 of the resistance device RD and the first electrode ET1 of the transistor TR may be electrodes that are electrically connected to each other, or may be integrated with each other via another connection pattern.

The first voltage V1 applied to the first connection electrode ER1 of the resistance device RD may be a voltage level that is different from the second voltage V2 applied to the second electrode ET2 of the transistor TR. As an example, the first voltage V1 applied to the first connection electrode ER1 of the resistance device RD may be a high potential voltage level VDD, and the second voltage V2 applied to the second electrode ET2 of the transistor TR may be a low potential voltage level VSS. As an example, the first voltage V1 applied to the first connection electrode ER1 of the resistance device RD may be a low potential voltage level VSS, and the second voltage V2 applied to the second electrode ET2 of the transistor TR may be a high potential voltage level VDD.

Hereinafter, the structure of the transistor TR and the structure of the resistance device RD, which have been described above, will be described again with reference to the example of FIG. 9. As illustrated in the example of FIG. 9, the transistor TR may have a top-gate structure.

The oxide semiconductor layer OSL and the metal oxide film MOL may be on the substrate SUB. The gate insulation film GI may be on the oxide semiconductor layer OSL. The gate electrode G may be on the gate insulation film GI.

The insulation layer INS may be on the substrate SUB, and may cover the oxide semiconductor layer OSL, the metal oxide film MOL, the gate insulation film GI, and the gate electrode G. The first electrode ET1, the second electrode ET2, the first connection electrode ER1, and the second connection electrode ER2 may be on the insulation layer INS.

The second electrode ET2 may contact another portion of the oxide semiconductor layer OSL directly through a first hole of the insulation layer INS, or via another pattern. The first electrode ET1 may contact a portion of the oxide semiconductor layer OSL directly through a second hole of the insulation layer INS, or via another pattern.

The second connection electrode ER2 may contact an opposite end of the metal oxide film MOL directly through a third hole, or via another pattern. The second connection electrode ER2 may be disposed together with the first electrode ET1. The first connection electrode ER1 may contact one end of the metal oxide film MOL directly through a fourth hole of the insulation layer INS, or via another pattern.

With reference to the example of FIG. 9, the thickness T of the metal oxide film MOL of the resistance device RD may be smaller than the thickness Ts of the oxide semiconductor layer OSL of the transistor TR. For example, the thickness T of the metal oxide film MOL of the resistance device RD may be 200 Å, and the thickness Ts of the oxide semiconductor layer OSL of the transistor TR may be 300 Å.

The metal oxide film MOL of the resistance device RD may form a thin film for high-resistance characteristics. To achieve this, the metal oxide film MOL of the resistance device RD may be formed through a thin-film deposition method for control of thin-film deposition, such as metal-organic chemical vapor deposition (MOCVD) or atomic layer deposition (ALD).

Metal-organic chemical vapor deposition (MOCVD) is a kind of chemical vapor deposition (CVD) of forming a thin film by discharging a source gas onto a high temperature substrate SUB, and causing a disposition reaction on the surface of the substrate SUB, and refers to a case in which the source gas includes an organic metal complex, and is a technology of growing a thin film by thermally decomposing an organic metal gas on the heated substrate SUB. The MOCVD may be controlled at a lower temperature than in the CVD that uses a halide gas, and the thin film can be controlled in the atom order and a uniform film can be obtained.

The atomic layer deposition (ALD) method is a deposition method of forming a thin film by depositing particles formed through a chemical reaction between reaction gases by separating and supplying the reaction fuels, on the surface of the substrate SUB, and a deposition method of depositing a thin film through chemical deposition of one reaction fuel on the substrate SUB, on which the thin film may be deposited, and then through chemical depositions of a second or third gas on the substrate.

When the MOCVD or ALD method is used, thin film productivity or growth rate may be decreased as compared with a general physical vapor deposition (PVD) or general another chemical vapor deposition (CVD) method, but the thickness of the thin film may be finely controlled as the application property of the thin film may be excellent. For example, when the MOCVD or ALD method may be used, a thin film having excellent step coverage characteristics can be formed. Further, according to the MOCVD or ALD method, as compared with other general deposition methods, such as sputtering, a thin film having more excellent thickness uniformity and composition uniformity and a higher density can be formed.

The metal oxide film MOL formed through the MOCVD or ALD method may be a very thin film. The thickness deviation of the metal oxide film MOL formed through the MOCVD or ALD method according to locations may be very small. For example, the metal oxide film MOL may have an excellent thickness uniformity (for example, a low thickness unevenness). For example, the thickness unevenness (that may be a ratio of a portion of an uneven thickness to the entire metal oxide film MOL) that represents a degree of thickness unevenness of the metal oxide film MOL formed though the MOCVD or ALD method may be less than 7%, and may be around 3.3% as a detained example value.

The metal oxide film MOL formed through the MOCVD or ALD method may have a high density. For example, the density of the metal oxide film MOL formed through the MOCVD or ALD method may be a high density of more than 5.8 g/m$^3$, and may be 6.1 g/m$^3$ as a detailed example value. The oxide semiconductor layer OSL of the transistor TR may also be formed through a thin film deposition method for control of thin film deposition, such as metal-organic chemical vapor deposition (MOCVD) or atomic layer deposition (ALD).

With reference to the example of FIG. 10, the width W of the metal oxide film MOL of the resistance device RD may be smaller than the width Ws of the oxide semiconductor layer OSL of the transistor TR. The oxide semiconductor layer OSL of the transistor TR may be an N-type oxide semiconductor layer. For example, the N-type oxide semiconductor layer may include one or more of an Indium Zinc Oxide (IZO), an indium gallium zinc oxide (IGZO), and an indium tin zinc oxide (ITZO).

The oxide semiconductor layer OSL of the transistor TR may be a P-type oxide semiconductor layer. For example, the P-type oxide semiconductor layer may include one or more of: $CuO_x$, $SnO_x$, and $NiO_x$.

When the oxide semiconductor layer OSL of the transistor TR may be an N-type oxide semiconductor layer, for example, with reference to the example of FIG. 11, the oxide semiconductor layer OSL may include IGZO. For example, the oxide semiconductor layer OSL may be IGZO-based. The composition ratio of indium (In), gallium (Ga), and zinc (Zn) of the IGZO may be 1:1:1, or may have a composition ratio that may be similar to the 1:1:1 composition ratio.

FIG. 11 illustrates a carrier concentration ($cm^{-3}$) of a thin film according to the composition ratio (concentration) of In, Ga, and Zn. With reference to the example of FIG. 11, zinc Zn may act as a frame of the thin film to increase the mobility of the thin film, and Ga may restrain the mobility of the thin film.

Accordingly, with reference to the example of FIG. 11, as the composition ratio (concentration) of In increases, the carrier concentration of the thin film may increase. Further, as the composition ratio (concentration) of Ga increases, the carrier concentration of the thin film may decrease. Accordingly, in FIG. 11, when the thin film is gallium zinc oxide (GZO)-based, the mobility restraint characteristics of the thin film may be predominant so that it may be advantageous in forming a resistant thin film. When the thin film is indium zinc oxide (IZO)-based, the mobility improvement characteristics of the thin film may be predominant so that it may be advantageous in forming the thin film of a high conductivity.

When the oxide semiconductor layer OSL of the transistor TR includes an IGZO having a composition ratio of In, Ga, and Zn of 1:1:1, the oxide semiconductor layer OSL can appropriately function both to improve mobility and restrain mobility. Accordingly, the transistor TR may be appropriately set the resistance value Rch_ON during turn-on and the resistance value Rch_OFF during turn-off to a range in which the signal inversion performance may be improved.

With reference to the example of FIG. 11, so that the signal inversion device 100 has a high signal inversion performance, the metal oxide film MOL, functioning as an actual resistor in the resistance device RD, may have high resistance characteristics. Accordingly, the metal oxide film MOL of the resistance device RD may include gallium zinc oxide (GZO) that may be advantageous in forming a resistance thin film. Among the Ga and the Zn of the GZO constituting the metal oxide film MOL, the Ga may realize high resistance characteristics, such that the metal oxide film MOL may be formed to have a composition ratio of 50%, a composition ratio of around 50%, or a composition ratio of 50% or more.

FIG. 12 illustrates a resistivity (Ω cm) of a thin film according to the composition ratio (concentration) of In, Ga, and Zn. With reference to the example of FIG. 12, Zn may act as a frame of the thin film to increase the mobility of the thin film, and Ga may restrain the mobility of the thin film.

Accordingly, with reference to FIG. 12, as the composition ratio (concentration) of In increases, the resistivity of the thin film may decrease. Further, as the composition ratio (concentration) of Ga increases, the resistivity of the thin film may increase.

For example, in the case of a GZO having a concentration of Ga of 50%, the resistivity of the thin film may greatly increase. The metal oxide film MOL may have a resistivity of 10 Ωm.

Accordingly, as the metal oxide film MOL of the resistance device RD may include a GZO of a Ga concentration of 50%, the resistance device RD may have high resistance characteristics having a high resistivity of 10 Ωcm, a high resistivity of around 10 Ωcm, or a high resistivity of 10 Ωcm or more. Accordingly, the signal inversion device 100 may have a high signal inversion performance.

With reference to the example of FIG. 13, the resistance value R of the resistance device RD may be calculated. FIG. 13 illustrates a section between opposite ends of the metal oxide film MOL of the resistance device RD, to which the first connection electrode ER1 and the second connection electrode ER2 may be connected.

When the length of the metal oxide film MOL is 'L', the width of the metal oxide film MOL is 'W', the thickness of the metal oxide film MOL is 'T', and the resistivity of the metal oxide film MOL is 'p', the resistance value 'R' of the metal oxide film MOL of the resistance device RD may be calculated as in Equation 9. In Equation 9, 'A' denotes a cross-sectional area (W×T) of the metal oxide film MOL.

$$R = \rho \times (L/A) = \rho \times (L/WT) = (\rho/T) \times (L/W) \quad \text{[Equation 9]}$$

Equation 10 may be obtained as follows by calculating the resistance value R of the resistance device RD, for example, with the presumption that the thickness T of the metal oxide film MOL is 200 Å, the metal oxide film MOL includes a GZO having a Ga concentration of 50%, and the resistivity p of the metal oxide film MOL is 10 Ωcm.

$$R = (\rho/T) \times (L/W) = \quad \text{[Equation 10]}$$
$$(10 \, \Omega \, cm \times 200 \, \text{Å}) \times (L/W) = 5 \times 10^6 \times (L/W)(\Omega)$$

As described above, the length L of the metal oxide film MOL of the resistance device RD may be larger than the width W of the metal oxide film MOL. For example, if the length L of the metal oxide film MOL of the resistance device RD is two times of the width W of the metal oxide film MOL (L=2 W), the resistance value R of the resistance device RD may be 10 MΩ. For example, the signal inversion performance described above with reference to the examples of FIGS. 2 to 7 may be derived.

The resistance value (R=10 MΩ) of the metal oxide film MOL of the resistance device RD may be larger than the resistance value (Rch_ON=100 kΩ) of the transistor TR when the transistor TR is turned on, for example, when a channel CH is formed in the oxide semiconductor film MOL. Further, the resistance value R of the metal oxide film MOL of the resistance device RD may be smaller than the resistance value (Rch_OFF=1 TΩ) of the transistor TR when the transistor TR is turned off, for example, when a channel CH is not formed in the oxide semiconductor film MOL.

The signal inversion device 100 according to an embodiment of the present disclosure may be disposed together with other electrodes and wiring lines on the display panel when the display panel of the display device having a lighting or image display function is manufactured. Hereinafter, a display device, to which the signal inversion device 100 according to an embodiment of the present disclosure may be applied, will be described.

Figure 14:
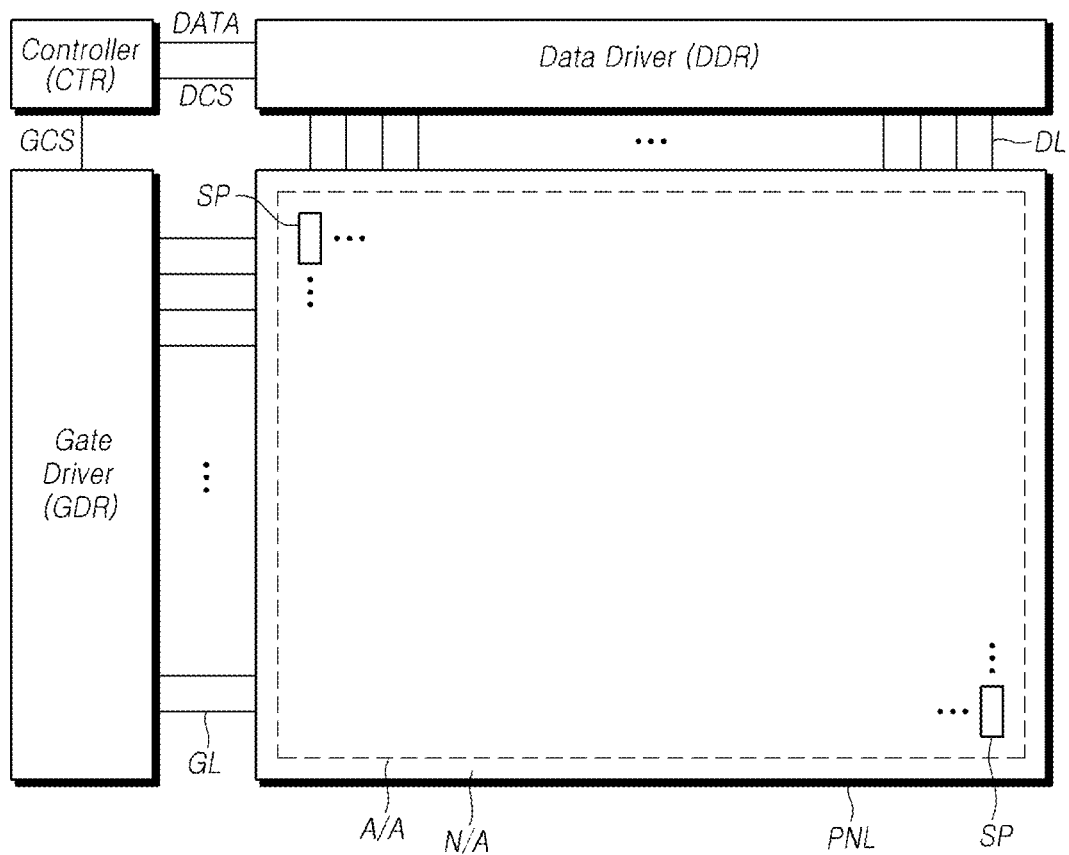
FIG. 14 is a system diagram of a display device according to an embodiment of the present disclosure.

FIG. 14 is a system diagram of a display device according to an embodiment of the present disclosure.

With reference to the example of FIG. 14, the display device 1400 according to an embodiment of the present disclosure may include an electronic device for displaying an image or information, and may further include a lighting device and a light-emitting device. The display device 1400 according to an embodiment of the present disclosure may include a display panel PNL that may display an image or may output light, and a driving circuit that may drive the display panel PNL. A plurality of data lines DL and a plurality of gate lines GL may be disposed in the display panel PNL, and plurality of sub-pixels SP defined by the plurality of data lines DL and the plurality of gate lines GL may be arranged in a matrix type.

In the display panel PNL, the plurality of data lines DL and the plurality of gate lines GL may cross each other. For example, the plurality of gate lines GL may be arranged in rows or columns, and the plurality of data lines DL may be arranged in columns or rows. In the following, for convenience of description, it may be presumed that the plurality of gate lines GL are disposed in rows, and the plurality of data lines DL are disposed in columns.

In the display panel PNL, in addition to the plurality of data lines DL and the plurality of gate lines GL, different kinds of signal wiring lines may be disposed according to the structures of the sub-pixels. Driving voltage wiring lines, a reference voltage wiring line, or a common voltage wiring line may be further disposed.

The display panel PNL may be a display panel of various types, such as a liquid crystal display (LCD) panel, and an organic light-emitting diode (OLED) panel. The kinds of the signal wiring lines disposed in the display panel PNL may be different according to the structures of the sub-pixels, the display panel type (e.g., an LCD panel or an OLED panel), and the like. In the present disclosure, the signal wiring lines may be a concept including an electrode, to which a signal may be applied.

The display panel PNL may include an active area A/A, in which an image may be displayed, and a non-active area N/A that may correspond to an outskirt or peripheral area, and in which an image may not be displayed. The non-active area N/A may be referred to as a "bezel area."

A plurality of sub-pixels SP for displaying an image may be in the active area A/A. In the non-active area N/A, a pad part may be disposed, to which a data driver DDR may be electrically connected, and a plurality of data link lines for connecting the pad part to the plurality of data lines DL may be disposed. The plurality of data link lines may be parts in which the plurality of data lines DL may extend to the non-active area N/A or to separate patterns electrically connected to the plurality of data lines DL.

Further, gate driving related wiring lines for delivering a voltage (signal) that may be necessary for gate driving to the gate driver GDR through the pad part, to which the data driver DDR may be electrically connected, may be disposed in the non-active area N/A. For example, the gate driving related wiring lines may include clock wiring lines for delivering a clock signal, gate voltage wiring lines for delivering a gate voltage VGH and VGL, and gate driving control signal wiring lines for delivering various control signals that may be necessary for generating a scan signal (gate signal). Differently from the gate lines GL disposed in the active area A/A, the gate driving related wiring lines may be disposed in the non-active area N/A.

The driving circuit may include a data driver DDR that may drive the plurality of data lines DL, a gate driver GDR that may drive the plurality of gate lines GL, and a controller CTR that may control the data driver DDR and the gate driver GDR. The data driver DDR may output a data voltage to the plurality of data lines DL to drive the plurality of data lines DL.

The gate driver GDR may output a scan signal to the plurality of gate lines GL to drive the plurality of gate lines GL. In the present disclosure, a scan signal may be also referred to as a "gate signal."

The controller CTR may supply various control signals DCS and GCS that may be necessary for driving operations of the data driver DDR and the gate driver GDR to control the driving operations of the data driver DDR and the gate driver GDR. Further, the controller CTR may supply image data DATA to the data driver DDR.

The controller CTR may start scanning according to timings implemented in respective frames, may convert input image data input from the outside according to a data signal format used in the data driver DDR, may output the converted image data DATA, and may control data driving at a suitable time according to the scanning. To control the data driver DDR and the gate driver GDR, the controller CTR may receive timing signals, such as a vertical synchronous signal Vsync, a horizontal synchronous signal Hsync, an input data enable (DE; Data Enable) signal, and a clock signal CLK, from the outside (e.g., a host system); may generate various control signals; and may output the generated control signals to the data driver DDR and the gate driver GDR. For example, to control the gate driver GDR, the controller CTR may output various gate control signals GCS including a gate start pulse GSP, a gate shift clock GSC, and a gate output enable signal GOE. Further, to control the data driver DDR, the controller CTR may output various data control signals DCS, including a source start pulse SSP, a source sampling clock SSC, and a source output enable signal SOE.

The controller CTR may be a timing controller used in a general display technology, and/or may be a control device including the timing controller, which further performs other control functions. The controller CTR may be implemented by a separate component from the data driver DDR, and may be implemented by an integrated circuit together with the data driver DDR.

The data driver DDR may drive the plurality of data lines DL by receiving image data DATA from the controller CTR and supplying a data voltage to the plurality of data lines DL. The data driver DDR may be also referred to as a "source driver." The data driver DDR may send and receive various signals to and from the controller CTR through various interfaces.

The gate driver GDR may sequentially supply a scan signal to the plurality of gate lines GL to sequentially drive the plurality of gate lines GL. The gate driver GDR may sequentially supply a scan signal of an on voltage or an off voltage to the plurality of gate lines GL according to a control of the controller CTR. When a particular gate line is opened by the gate driver GDR, the data driver DDR may convert the image data DATA received from the controller CTR into a data voltage of an analog form, and may supply the converted data voltage to the plurality of data lines DL.

The data driver DDR may be located on one side (e.g., the upper side or the lower side) of the display panel PNL, or may be located on both sides (e.g., the upper side and the lower side) of the display panel PNL, depending on a driving scheme or a panel design scheme. The gate driver GDR may be located on one side (e.g., the left side or the right side) of the display panel PNL, or may be located both sides (e.g., the left side and the right side) of the display panel PNL, depending on a driving scheme or a panel design scheme.

The data driver DDR may be implemented to include at least one source driver integrated circuit SDIC. Each source driver integrated circuit SDIC may include a shift register, a latch circuit, a digital-analog converter DAC, and an output buffer. The data driver DDR may further include one or more analog to digital converters ADC.

Each source driver integrated circuit SDIC may be a tape automated bonding (TAB) type or a chip-on-glass (COG) type. Each source driver integrated circuit SDIC may be connected to a bonding pad of the display panel PNL, or may be directly disposed on the display panel PNL. Each source driver integrated circuit SDIC may be integrated and disposed in the display panel PNL. Further, each source driver integrated circuit SDIC may be implemented as a chip-on-film (COF) type. Each source driver integrated circuit SDIC may be mounted on a circuit film, and may be electrically connected to the data lines DL in the display panel PNL through the circuit film. For example, the data driver DDR may be implemented as various types (TAB, COG, COF, and the like)

The gate driver GDR may include a plurality of gate driving circuits GDC. The plurality of gate driving circuits GDC may respectively correspond to the plurality of gate lines GL. Each gate driving circuit GDC may include a shift register and a level shifter.

Each gate driving circuit GDC may be a tape automated bonding (TAB) type or a chip-on-glass (COG) type, and may be connected to the bonding pad of the display panel PNL. Further, each gate driving circuit GDC may be implemented as a chip-on-film (COF) type. Each gate driving circuit GDC may be mounted on a circuit film, and may be electrically connected to the gate lines GL in the display panel PNL through the circuit film. Further, each gate driving circuit GDC may be implemented in a gate-in-panel (GIP) type, and may be embedded in the display panel PNL to be directly formed in the display panel PNL. For example, the gate driver GDR may be implemented in various types (TAB, COG, COF, GIP, and the like).

Figure 15:
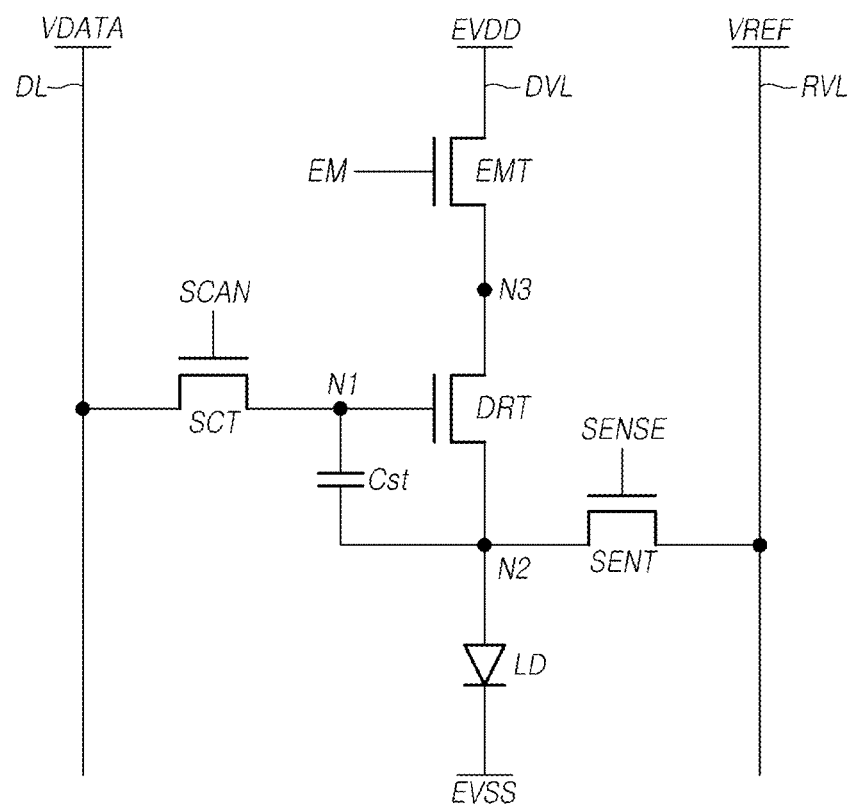
FIG. 15 is a sub-pixel circuit of a display device according to an embodiment of the present disclosure.

FIG. 15 is a circuit of sub-pixels of a display device according to an embodiment of the present disclosure.

With reference to the example of FIG. 15, each of the sub-pixels SP in the display panel PNL included in the display device 1400, according to an embodiment of the present disclosure, may include a light-emitting device LD, a driving transistor DRT, a scan transistor SCT, a light emission control transistor EMP, a sense transistor SENT, and a storage capacitor Cst. The light-emitting device LD may include an anode electrode, a cathode electrode, and a light-emitting layer between the anode electrode and the cathode electrode.

The anode electrode of the light-emitting device LD may be electrically connected to a second node N2, and a base voltage EVSS may be applied to the cathode electrode of the light-emitting device LD. The light-emitting device LD, for example, may be an organic light-emitting diode (OLED), a light-emitting diode (LED), and the like.

The driving transistor DRT may drive the light-emitting device LD by supplying a driving current to the light-emitting device LD. The gate node of the driving transistor DRT may be electrically connected to a first node N1, the source node or the drain node of the driving transistor DRT may be electrically connected to the second node N2, and the drain node or the source node of the driving transistor DRT may be electrically connected to the third node N3.

The scan transistor SCT may be electrically connected between the first node N1 and the data line DL, and an on/off operation of the scan transistor SCT may be controlled by a scan signal SCAN. The drain node or the source node of the scan transistor SCT may be electrically connected to the data line DL, the source node or the drain node of the scan transistor SCT may be electrically connected to the first node N1, and the gate node of the scan transistor SCT may be electrically connected to the first gate line GL. When the scan transistor SCT is turned on, the data voltage VDATA supplied through the data line DL may be delivered to the gate node of the driving transistor DRT.

The sense transistor SENT may be electrically connected between the second node N2 and a reference voltage line RVL that supplies a reference voltage VREF, and an on/off operation of the sense transistor SENT may be controlled by a sense signal SENSE. The drain node or the source node of the sense transistor SENT may be electrically connected to the reference voltage line RVL, the source node or the drain node of the sense transistor SENT may be electrically connected to the second node N2, and the gate node of the sense transistor SENT may be electrically connected to the second gate line GL.

The first gate line GL electrically connected to the gate node of the scan transistor SCT and the second gate line GL electrically connected to the gate node of the sense transistor SENT may be the same or different. The first gate line GL electrically connected to the gate node of the scan transistor SCT may be referred to as a "scan line SCL" in the following description.

The light emission control transistor EMT may be electrically connected between the third node N3 and the driving voltage line DVL that may supply a driving voltage EVDD, and an on/off operation of the light emission control transistor EMP may be controlled by the light emission control signal EM. The drain node or the source node of the light emission control transistor EMT may be electrically connected to the driving voltage line DVL, the source node or the drain node of the light emission control transistor EMT may be electrically connected to the third node N3, and the gate node of the light emission control transistor EMT may be electrically connected to the third gate line GL.

The third gate line GL electrically connected to the gate node of the light emission control transistor EMT may be referred to as a "light emission control line EML" in the following description. The light emission control transistor EMT may be a transistor that may control light emission of the light-emitting device LD, and may control whether the driving current will flow to the light-emitting device LD or not.

Generally, an on/off timing of the light emission control transistor EMT may be opposite to the on/off timing of the scan transistor SCT. For example, when the scan transistor SCT is in a turn-on period, the light emission control transistor EMT may be in a turn-off period. In contrast, when the scan transistor SCT is in a turn-off period, the light emission control transistor EMT may be in a turn-on period. A storage capacitor Cst may be electrically connected between the first node N1 and the second node N2, and may maintain voltages at opposite sides for a predetermined period of time.

Figure 16:
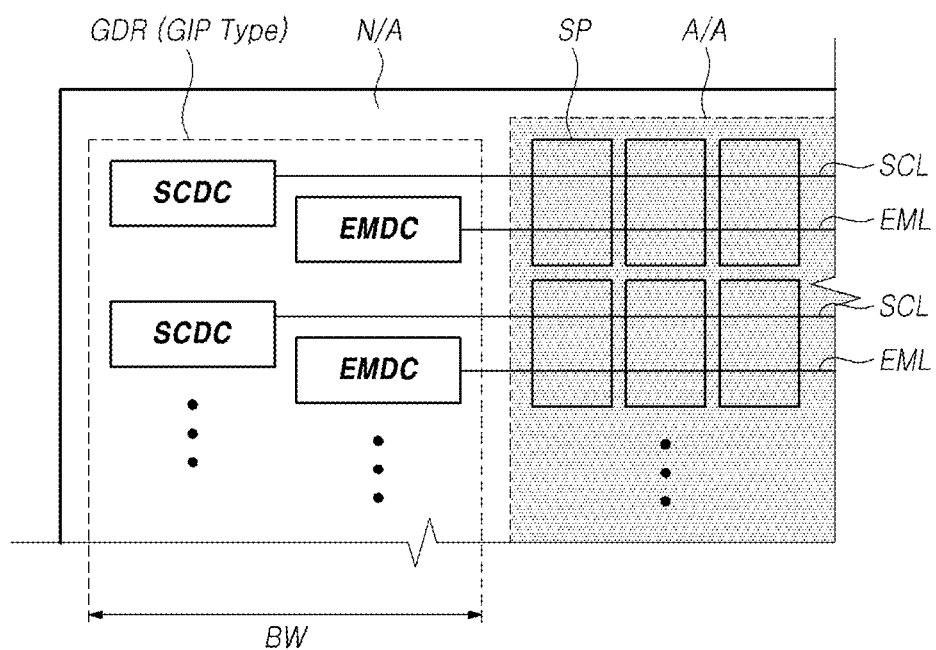
FIG. 16 is a view illustrating a scan driver circuit and a light emission control driver circuit disposed in a non-active area of a display panel according to an embodiment of the present disclosure.

FIG. 16 is a view illustrating a scan driver circuit and a light emission control driver circuit disposed in a non-active area of a display panel according to an embodiment of the present disclosure.

In consideration of the structure of the sub-pixels of the example of FIG. 15, the gate driver GDR may include a scan driver circuit SCDC that may output a scan signal SCAN to a scan line SCL, and a light emission control driver circuit EMDC that may output a light emission control signal EM to a light emission control line EML. As illustrated in to example of FIG. 16, the gate driver GDR may be implemented as a gate-in-panel (GIP) type. For example, the scan driver circuit SCDC and the light emission control driver circuit EMDC may be in the non-active area N/A of the display panel PNL. In this way, when a plurality of scan driver circuits SCDC and a plurality of light emission control driver circuits EMDC are in the non-active area N/A of the display panel PNL, the width BW of a bezel area corresponding to the non-active area N/A may increase.

Figure 17:
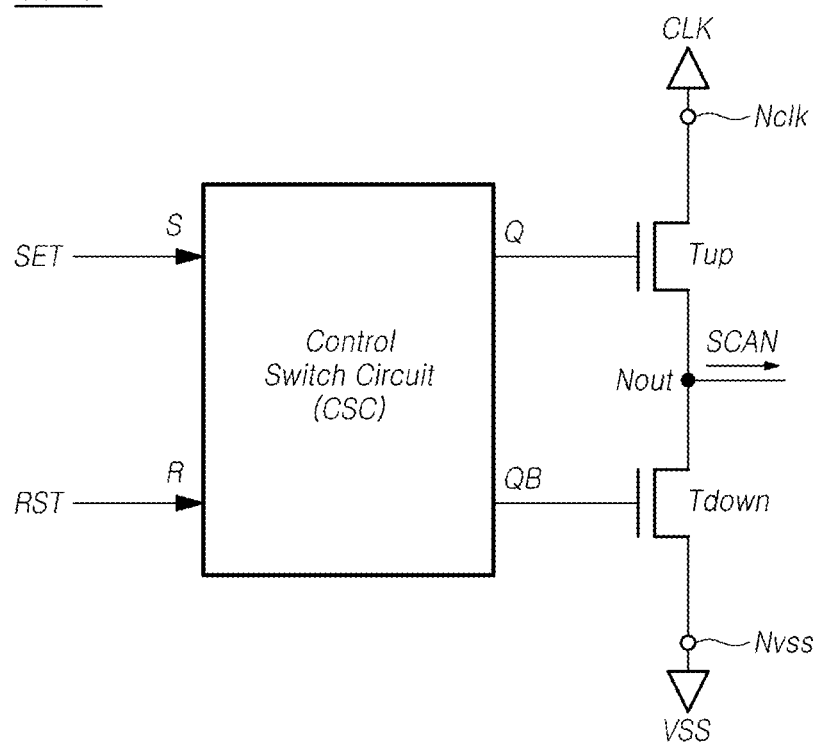
FIG. 17 is a view illustrating a scan driver circuit according to an embodiment of the present disclosure.

FIG. 17 is a view illustrating a scan driver circuit according to an embodiment of the present disclosure.

With reference to the example of FIG. 17, each scan driver circuit SCDC may include a pull-up transistor Tup, a pull-down transistor Tdown, and a control switch circuit CSC. The control switch circuit CSC may be a circuit that may control the voltage of a Q node corresponding to the gate node of the pull-up transistor Tup and the voltage of a QB node corresponding to the gate node of the pull-down transistor Tdown, and may include several switches (transistors).

The pull-up transistor Tup may be a transistor that may supply a scan signal SCAN corresponding to a first level voltage (e.g., a high level voltage VGH) to the scan line SCL through a gate signal output node Nout. The pull-down transistor Tdown may be a transistor that may supply a scan signal SCAN corresponding to a second level voltage (e.g., a low level voltage VGL) to the scan line SCL through the gate signal output node Nout. The pull-up transistor Tup and the pull-down transistor Tdown may be turned on at different timings.

The pull-up transistor Tup may be electrically connected between a clock signal application node Nclk to which a clock signal CLK may be applied, and a gate signal output node Nout electrically connected to the scan line SCL, and may be turned on or off by the voltage of the Q node. The gate node of the pull-up transistor Tup may be electrically connected to the Q node. The drain node or the source node of the pull-up transistor Tup may be electrically connected to the clock signal application node Nclk. The source node or the drain node of the pull-up transistor Tup may be electrically connected to the gate signal output node Nout, from which the scan signal SCAN may be output.

The pull-up transistor Tup may be turned on by the voltage of the Q node, and may output the scan signal SCAN having a high level voltage VGH in a high level section of the clock signal CLK to the gate signal output node Nout. The scan signal SCAN of the high level voltage VGH output to the gate signal output node Nout may be supplied to the corresponding scan line SCL.

The pull-down transistor Tdown may be electrically connected between the gate signal output node Nout and the base voltage node Nvss, and may be turned on or off by the voltage of the QB node. The gate node of the pull-down transistor Tdown may be electrically connected to the QB node. The drain node or the source node of the pull-down transistor Tdown may be electrically connected to the base voltage node Nvss, and a base voltage VSS corresponding to a static voltage may be applied to the drain node or the source node of the pull-down transistor Tdown. The source node or the drain node of the pull-down transistor Tdown may be electrically connected to the gate signal output node Nout, from which the scan signal SCAN may be output.

The pull-down transistor Tdown may be turned on by the voltage of the QB node, and may output the scan signal SCAN of the low level voltage VGL to the gate signal output node Nout. Accordingly, the scan signal SCAN of the low level voltage VGL may be supplied to the corresponding scan line SCL through the gate signal output node Nout. The scan signal SCAN of the low level voltage VGL, for example, a base voltage VSS.

The control switch circuit CSC may include two or more transistors, and may include main nodes, such as a Q node, a QB node, a set node S (which may be referred to as a "start node"), and a reset node R. According to occasions, the control switch circuit CSC may further include an input node, to which various voltages, such as a driving voltage VDD, may be input.

In the control switch circuit CSC, the Q node may be electrically connected to the gate node of the pull-up transistor Tup, and may be repeatedly charged and discharged. In the control switch circuit CSC, the QB node may be electrically connected to the gate node of the pull-down transistor Tdown, and may be repeatedly charged and discharged. In the control switch circuit CSC, a set signal SET for instructing start of the gate driving of the corresponding gate driving circuit GDC may be applied to the set node S.

The set signal SET applied to the set node S may be a start signal VST that may be input from the outside of the gate driver GDR, and may be a signal (carry signal) obtained by feeding back the scan signal SCAN output from the gate driving circuit GDC of a previous stage of the current gate driving circuit GD. A reset signal RST applied to the reset node R by the control switch circuit CSC may be a reset signal for initiating the gate driving circuits GDC of all the stages at the same time, and may be a carry signal input from another stage (e.g., a previous stage or a following stage).

The control switch circuit CSC may charge the Q node in response to the set signal SET, and may discharge the Q node in response to the reset signal RST. The control switch circuit CSC may include an inverter circuit for charging or discharging the Q node and the QB node at different timings.

Figure 18:
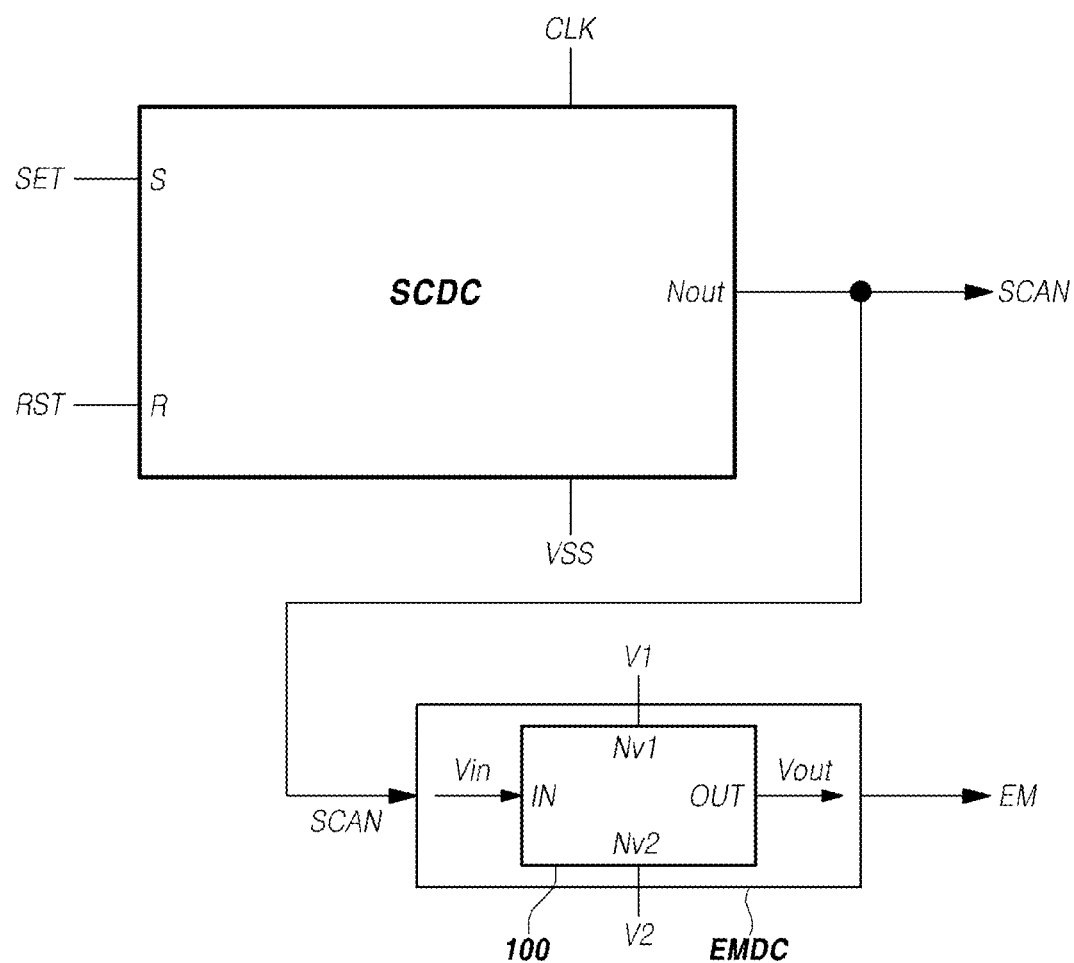
FIG. 18 is a view of a light emission control driver circuit to which a signal inversion device according to an embodiment of the present disclosure is applied.

FIG. 18 is a view of a light emission control driver circuit to which a signal inversion device according to an embodiment of the present disclosure may be applied.

With reference to the example of FIG. 18, the light emission control driver circuit EMDC may be implemented using the signal inversion device 100. For example, the light emission driver circuit EMDC may be the signal inversion device 100, itself.

However, the light emission control driver circuit EMDC may include a signal inversion device 100, and may further include other devices. For example, the light emission control driver circuit EMDC may further include a delay circuit that may delay an input signal Vin input to the signal inversion device 100 and an output signal Vout output from the signal inversion device 100.

When the light emission control driver circuit EMDC is the signal inversion device 100 or includes the signal inversion device 100, the light emission control driver circuit EMDC may include a resistance device RD electrically connected between a first voltage node Nv1 to which a first voltage V1 may be applied, and an output node OUT to which the light emission control line EML may be electrically connected; and a transistor TR, an on/off operation of which may be controlled by an input signal Vin, and which may be electrically connected between an output node OUT and a second voltage node Nv2, to which a second voltage, which may be different from the first voltage V1, may be applied. The light emission control driver circuit EMDC may include an input node IN to which an input signal Vin may be input, an output node OUT to which an output signal Vout may be output, a first voltage node Nv1 to which a first voltage V1 may be input, and a second voltage node Nv2 to which a second voltage V2 may be input.

The resistance device RD may be electrically connected between the first voltage node Nv1, to which the first voltage V1 may be applied, and an output node OUT, to which the light emission control line EML may be electrically connected. An on/off operation of the transistor TR may be controlled by the input signal Vin, and the transistor TR may be electrically connected between the output node OUT and the second voltage node Nv2 to which a second voltage V2, which may be different from the first voltage V1, may be applied.

The resistance device RD may include a first connection electrode ER1 and a second connection electrode ER2. The first connection electrode ER1 of the resistance device RD may be electrically connected to the first voltage node Nv1. The second connection electrode ER2 of the resistance device RD may be electrically connected to the output node OUT.

The transistor TR may include a first electrode ET1, a second electrode ET2, and a gate electrode G. The input signal Vin may be applied to the gate electrode G of the transistor TR.

The first electrode ET1 of the transistor TR may be electrically connected to the output node OUT. The second electrode ET2 of the transistor TR may be electrically connected to the second voltage node Nv2. The input signal Vin may be applied to the gate electrode G of the transistor TR.

The second connection electrode ER2 of the resistance device RD and the first electrode ET1 of the transistor TR may be electrically connected to each other or integrated with each other. The transistor TR may be an N-type transistor or a P-type transistor.

The input signal Vin may be a scan signal SCAN output from the scan driver circuit SCDC. The precise voltage of the input signal Vin may slightly vary, but, in the aspect of signal timings, the input signal Vin may be the same as a scan signal SCAN output from the scan driver circuit SCDC. Alternatively, the input signal Vin may be a signal that may slightly temporally delay the scan signal SCAN.

The light emission control driver circuit EMDC may output a light emission control signal EM obtained by inverting the voltage level of the input signal Vin to the output node OUT. Accordingly, the output signal Vout may be a signal having a voltage level that may be opposite to the voltage level of the input signal Vin.

The output signal Vout may be a signal in which only the voltage level of the output signal Vout may be opposite to the voltage level of the input signal Vin, but the voltages of the output signal Vout and the input signal Vin may change temporally at the same timings. Alternatively, the output signal Vout may be a signal in which, not only the voltage level of the output signal Vout may be opposite to the voltage level of the input signal Vin, but also the changes of the voltages of the output signal Vout and the input signal Vin may be slightly temporally delayed. One of the first voltage V1 and the second voltage V2 input to the light emission control driver circuit EMDC may have a voltage value corresponding to the high level voltage of the scan signal SCAN, and the remaining one of the first voltage V1 and the second voltage V2 may have a voltage value corresponding to the low level voltage of the scan signal SCAN.

The transistor TR of the signal inversion device 100 included in the light emission control driver circuit EMDC may be an N-type or P-type transistor. When the transistor TR of the signal inversion device 100 included in the light emission control driver circuit EMDC is an N-type transistor, the first voltage V1 may have a voltage value that may be higher than the second voltage V2. For example, the first voltage V1 may be a high potential voltage VDD, and the second voltage V2 may be a low potential voltage VSS. When the transistor TR of the signal inversion device 100 included in the light emission control driver circuit EMDC is a P-type transistor, the second voltage V2 may have a voltage value that may be higher than the first voltage V1. For example, the first voltage V1 may be a low potential voltage VSS, and the second voltage V2 may be a high potential voltage VDD. The signal inversion device 100 included in the light emission control driver circuit EMDC may be the same as the signal inversion device 100 described with reference to any of the examples of FIGS. 1 to 13.

Figure 19:
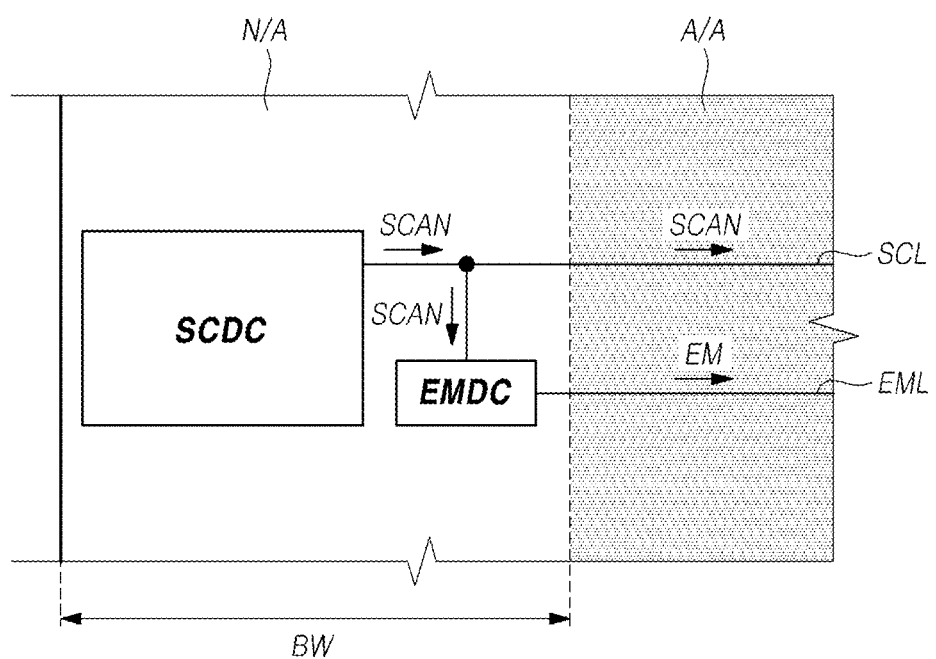
FIG. 19 is a view for explaining a bezel decreasing effect according to a light emission control driver circuit to which a signal inversion device according to an embodiment of the present disclosure is applied.

FIG. 19 is a view for explaining a bezel decreasing effect according to a light emission control driver circuit to which a signal inversion device according to an embodiment of the present disclosure may be applied.

A general light emission control driver circuit may include considerably many transistors and capacitors, and also requires various kinds of power sources. Accordingly, the general light emission control driver circuit has an disadvantage of a very large size (extent). However, because only one resistance device RD, one transistor TR, and two power sources V1 and V2 are necessary when the light emission control driver circuit EMDC is implemented using the signal inversion device 100 according to an embodiment of the present disclosure, a light emission control driver circuit EMDC that occupies a small extent can be implemented.

As illustrated in the example of FIG. 19, the extent of the area, in which the light emission control driver circuit EMDC may be disposed in the display panel, may be considerably smaller than the extent of the area, in which the scan driver circuit SCDC may be disposed in the display panel. Accordingly, as illustrated in FIG. 19, the bezel area corresponding to the non-active area N/A can be considerably reduced.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:
1. A display device, comprising:
  a display panel comprising:
    a plurality of sub-pixels; and
    a plurality of scan lines respectively connected to each of the plurality of sub-pixels; and
    a plurality of light emission control lines respectively connected to each of the plurality of sub-pixels;
  a scan driver circuit configured to output respective scan signals to the plurality of scan lines; and a light emission control driver circuit configured to output respective light emission control signals to the plurality of light emission control lines, the light emission control driver circuit comprising:
  a resistance device electrically connected between:
    a first voltage node configured to receive a first voltage; and
    an output node electrically connected to the plurality of light emission control lines; and
  a transistor electrically connected between the output node and a second voltage node configured to receive a second voltage that is different from the first voltage,
  wherein an on/off operation of the transistor is controlled according to an input signal, and
  wherein a resistance value of the resistance device is the same when the transistor is turned on as when the transistor is turned off.

2. The display device of claim 1, wherein the input signal is the scan signal output from the scan driver circuit.

3. The display device of claim 1, wherein the light emission control driver circuit is further configured to output the light emission control signals obtained by inverting the voltage level of the input signal to the output node.

4. The display device of claim 1, wherein:
one of the first voltage and the second voltage has a voltage value corresponding to the high level voltage of the light emission control signal; and
the remaining one of the first voltage and the second voltage has a voltage value corresponding to the low level voltage of the light emission control signal.

5. The display device of claim 1, wherein:
when the transistor is an N-type transistor, the first voltage has a voltage value that is higher than the second voltage; and
the light emission control driver circuit is further configured to:
  when the input signal is a high level voltage, output the light emission control signals having a voltage value corresponding to the second voltage to the output node as the transistor is turned on; and
  when the input signal is a low level voltage, output the light emission control signals having a voltage value corresponding to the first voltage to the output node as the transistor is turned off.

6. The display device of claim 1, wherein:
when the transistor is a P-type transistor, the second voltage has a voltage value that is higher than the first voltage; and
the light emission control driver circuit is further configured to:
  when the input signal is a high level voltage, output the light emission control signal having a voltage value corresponding to the first voltage to the output node as the transistor is turned off; and
  when the input signal is a low level voltage, output the light emission control signals having a voltage value corresponding to the second voltage to the output node as the transistor is turned on.

7. The display device of claim 1, wherein:
the resistance value of the resistance device is larger than the resistance value of the transistor when the transistor is turned on; and
the resistance value of the resistance device is smaller than the resistance value of the transistor when the transistor is turned off.

8. The display device of claim 1, wherein:
the transistor comprises:
  an oxide semiconductor layer;
  a first electrode connected to a first portion of the oxide semiconductor layer;
  a second electrode connected to a second portion of the oxide semiconductor layer; and
  a gate electrode configured to receive the input signal;
the first electrode is electrically connected to the output node;
the second electrode is electrically connected to the second voltage node; and
the gate electrode is configured to receive the input signal corresponding to the scan signal.

9. The display device of claim 8, wherein the oxide semiconductor layer is an N-type oxide semiconductor layer.

10. The display device of claim 8, wherein the oxide semiconductor layer is a P-type oxide semiconductor layer.

11. The display device of claim 8, wherein:
the oxide semiconductor layer comprises an indium gallium zinc oxide; and
the composition ratio of the indium, the gallium, and the zinc is 1:1:1.

12. The display device of claim 8, wherein:
the resistance device comprises:
  a metal oxide film;
  a first connection electrode electrically connected to one end of the metal oxide film; and
  a second connection electrode electrically connected to an opposite end of the metal oxide film;
the first connection electrode is electrically connected to the first voltage node;
the second connection electrode is electrically connected to the output node; and
the second connection electrode and the first electrode are electrically connected to each other or integrated with each other.

13. The display device of claim 12, wherein:
the metal oxide film comprises a gallium zinc oxide; and
among gallium and zinc, the gallium has a composition ratio of 50% or more.

14. The display device of claim 12, wherein the metal oxide film has a resistivity of 10 $\Omega$cm or more.

15. The display device of claim 12, wherein the length of the metal oxide film is larger than the width of the metal oxide film.

16. The display device of claim 12, wherein the thickness of the metal oxide film of the resistance device is smaller than the thickness of the oxide semiconductor layer of the transistor.

17. The display device of claim 1, wherein:
the scan driver circuit and the light emission control driver circuit are in a non-active area of the display panel; and
the size of an area in the non-active area of the display panel, in which the light emission control driver circuit is disposed, is smaller than the size of an area in the non-active area of the display panel, in which the scan driver circuit is disposed.

18. The display device of claim 1, wherein:
each of the plurality of sub-pixels comprises:
  a light-emitting device;
  a driving transistor configured to supply a driving current to the light-emitting device;
  a scan transistor configured to deliver a data voltage to a gate node of the driving transistor; and
  a light emission control transistor configured to control light emission of the light-emitting device;

the gate node of the scan transistor is electrically connected to the scan line; and the gate node of the light emission control transistor is electrically connected to the light emission control line.

\* \* \* \* \*